United States Patent
Kofuji et al.

(10) Patent No.: US 11,398,371 B2
(45) Date of Patent: Jul. 26, 2022

(54) PLASMA PROCESSING APPARATUS

(71) Applicant: HITACHI HIGH-TECH CORPORATION, Tokyo (JP)

(72) Inventors: Naoyuki Kofuji, Tokyo (JP); Kenetsu Yokogawa, Tokyo (JP); Taku Iwase, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 116 days.

(21) Appl. No.: 16/286,338

(22) Filed: Feb. 26, 2019

(65) Prior Publication Data

US 2019/0295823 A1    Sep. 26, 2019

(30) Foreign Application Priority Data

Mar. 26, 2018   (JP) .............................. JP2018-057545

(51) Int. Cl.
*H01J 37/32* (2006.01)
*H01L 21/683* (2006.01)
*H01L 21/3065* (2006.01)

(52) U.S. Cl.
CPC .. *H01J 37/32706* (2013.01); *H01J 37/32091* (2013.01); *H01J 37/32541* (2013.01);
(Continued)

(58) Field of Classification Search
CPC ........... H01J 37/32706; H01J 37/32091; H01J 37/32541; H01J 37/32568;
(Continued)

(56) References Cited

U.S. PATENT DOCUMENTS 5,151,845 A * 9/1992 Watanabe ........... H01L 21/6831
279/128
5,426,558 A * 6/1995 Sherman ............. H01L 21/6831
269/8
(Continued)

FOREIGN PATENT DOCUMENTS

JP    H10-150100 A   6/1998
JP    2000-507745 A  6/2000
(Continued)

OTHER PUBLICATIONS

Office Action dated Jan. 4, 2022 in Japanese Application No. 2018-057545.

*Primary Examiner* — Charlee J. C. Bennett
(74) *Attorney, Agent, or Firm* — Miles & Stockbridge, P.C.

(57) ABSTRACT

A plasma processing apparatus includes a sample stage on which a sample is placed an inside of the processing chamber; a dielectric membrane forming an upper surface portion of the sample stage; a plurality of film-shaped electrodes which is disposed in the dielectric membrane, to which a DC power from a DC power supply is supplied and in which an electrostatic force for attracting the sample is formed; and a bias electrode (ESC base metal) disposed below the dielectric membrane and supplied with radio frequency power for forming a radio frequency bias potential from a radio frequency power supply during the processing of the sample. The plurality of electrodes includes a first electrode to which a positive polarity is imparted and a second electrode to which a negative polarity is imparted, wherein the first electrode and the second electrode are electrically connected to a corresponding positive electrode terminal and a corresponding negative electrode terminal of the DC power supply through the corresponding low pass filter circuits (LPF).

7 Claims, 13 Drawing Sheets

(52) U.S. Cl.
CPC .. *H01J 37/32568* (2013.01); *H01J 37/32577* (2013.01); *H01J 37/32678* (2013.01); *H01L 21/3065* (2013.01); *H01L 21/6833* (2013.01); *H01J 2237/3341* (2013.01)

(58) Field of Classification Search
CPC .......... H01J 37/32577; H01J 37/32678; H01J 2237/3341; H01L 21/3065; H01L 21/6833
See application file for complete search history.

(56) References Cited

U.S. PATENT DOCUMENTS

| | | | |
|---|---|---|---|
| 5,812,361 A | 9/1998 | Jones et al. | |
| 2007/0074813 A1* | 4/2007 | Okumura | H01L 21/2236 156/345.28 |
| 2007/0223173 A1* | 9/2007 | Fujisawa | H02N 13/00 361/234 |
| 2008/0236492 A1* | 10/2008 | Yamazawa | H01J 37/32091 118/723 I |
| 2009/0178764 A1 | 7/2009 | Kanno et al. | |
| 2011/0210811 A1* | 9/2011 | Scherer | G01R 33/3873 335/306 |
| 2011/0214811 A1* | 9/2011 | Ashida | C23C 16/50 156/345.28 |
| 2015/0221478 A1* | 8/2015 | Himori | H01J 37/32532 156/345.38 |

FOREIGN PATENT DOCUMENTS

| | | |
|---|---|---|
| JP | 2003059910 A | 2/2003 |
| JP | 2008244063 A | 10/2008 |
| JP | 2009170509 A | 7/2009 |
| JP | 2009231247 A | 10/2009 |

\* cited by examiner

4: SAMPLE
5: ESC SYSTEM
10: SAMPLE STAGE
11: ESC BASE METAL
12: DIELECTRIC MEMBRANE
122: MATCHING UNIT
123: RF POWER SUPPLY
30(31, 32): ELECTRODE
33(33A, 33B): LPF
34: DC POWER SUPPLY

PLASMA PROCESSING APPARATUS

BACKGROUND OF THE INVENTION

1. Field of the Invention

The present invention relates to a plasma processing technique. The present invention also relates to a technique for processing a sample such as a semiconductor wafer while attracting and holding the sample on the upper surface of a sample stage in the processing chamber.

2. Description of the Related Art

Conventionally, in the plasma processing apparatus, electrostatic attraction (may be described as Electro Static Chuck: ESC, etc.) system is used in order to hold the sample on the upper surface of the sample stage. The sample stage and the electrostatic attraction system generally have the following configuration. The sample stage includes an ESC base metal made of a conductor such as a metal, and a member made of dielectric (may be referred to as a dielectric membrane, a dielectric member, or the like) which constitutes the sample stage upper surface portion on the ESC base metal and has a predetermined thickness. The electrode for electrostatic attraction (may be referred to as an ESC electrode, for example) is disposed in the vicinity of the upper surface of the sample stage (that is, placement surface of the sample) in the sample stage. Electric power from a DC power supply is supplied to this electrode, electric charges are formed inside the dielectric membrane between the electrode and the sample and the sample, and as a result, an electrostatic force is generated between the electric charges. By the electrostatic force, the sample is held by being pressed against and attracted to the upper surface of the dielectric membrane, that is, the placement surface.

JP H10-150100 A and JP 2000-507745 A disclose examples of prior art related to the plasma processing apparatus and the electrostatic attraction system.

In JP H10-150100 A, a so-called bipolar ESC is disclosed. In the technique of JP H10-150100 A, a corresponding positive or negative DC voltage is applied to each of the plurality of electrodes embedded in the dielectric membrane from two DC power supplies where one output terminal of each DC power supply is grounded through a low pass filter. As a result, each electrode is set to a positive electrode and a negative electrode, and the sample is attracted by using an electrostatic force formed between the positive electrode and the negative electrode and the portion of the upper sample. In this technique, a low pass filter is provided, and the radio frequency power supplied to the ESC base metal from the radio frequency power supply electrically connected to the ESC base metal (that is, bias electrode) below the dielectric membrane of the sample stage is prevented from flowing to the DC power supply.

Furthermore, the technique of JP H10-150100 A discloses that the residual attraction of static electricity when the sample attracted on the upper surface of the dielectric membrane of the sample stage is detached upward and removed is suppressed. For that reason, any output terminal of the power supply path to the plurality of electrodes from the DC power supply is not grounded, and positive and negative voltages are directly applied to the electrodes of the positive polarity and the negative polarity from the positive and negative output terminals of the DC power supply completely brought to a floating potential.

Also, conventionally, a radio frequency bias technique is used. During the etching process of the sample using plasma, radio frequency power is applied from a radio frequency power supply to the ESC base metal (bias electrode) or the ESC electrode of the sample stage. In this case, a radio frequency bias potential of a predetermined magnitude is formed above the upper surface of the sample stage and above the upper surface of the sample thereon, and a voltage (referred to as a voltage Vdc) which can be regarded as the DC component thereof is generated.

SUMMARY OF THE INVENTION

In the prior art, since consideration has not been sufficient with respect to the following points, problems have occurred. In recent years, in the process of manufacturing a semiconductor device using a plasma processing apparatus, a multi-step etching process using a radio frequency bias technique and an electrostatic attraction technique or the like has been mainly offered. In this process, the voltage Vdc of the direct-current component of the radio frequency bias potential may fluctuate greatly between steps constituting the process. When this fluctuation occurs, the potential difference between the sample and the sample stage fluctuates, so that the amount of electric charge stored between them varies greatly. In addition, due to the effect of the voltage Vdc, the sum of the magnitudes of the positive and negative potentials of each pole of the ESC electrode does not become 0, and the electric charge induced inside the sample and the dielectric may be unbalanced in some cases. Due to this imbalance, the electrostatic attraction force is unstable.

For example, in the conventional etching process, a radio frequency bias potential is formed above the membrane structure in the upper surface of the sample attracted and held on the sample stage having the electrostatic attraction system. A variation of the amount of electric charge stored in the ESC electrode or the like is supplied as a current flowing from the plasma to the sample (sometimes referred to as an ESC current). The magnitude of the ESC current is larger as the amount of change of the voltage Vdc between the multiple steps is larger. Depending on the membrane structure exposed to the plasma, the ESC current may flow in a concentrated manner. When the radio frequency bias power is large between steps, a large ESC current transiently flows to the sample at the time of step change. This may cause damage to the membrane structure.

As described above, in the plasma processing apparatus using electrostatic attraction and radio frequency bias, etc. of the prior art example, the membrane structure of the sample may be damaged by the ESC current. In this case, there is a problem that the performance of the semiconductor device manufactured by performing the process using the plasma is impaired and the processing yield is lowered.

An object of the present invention is to provide a plasma processing apparatus capable of improving a processing yield.

A representative embodiment of the present invention is a plasma processing apparatus characterized by having the following structure. A plasma processing apparatus according to an embodiment includes a processing chamber which is disposed in a vacuum vessel and in which plasma is generated inside the vacuum vessel; a sample stage which is disposed inside of the processing chamber and on which a sample to be processed using the plasma is placed; a dielectric member forming an upper surface portion of the sample stage including a placement surface on which the sample is placed; a plurality of film-shaped electrodes which is disposed at a same height in a vertical direction inside the dielectric member, to which a DC power from a DC power supply is supplied, and which is electrically connected to the DC power supply via a low pass filter circuit including a first and a second low pass filter circuit, to which a DC power from the DC power supply is supplied, to which a predetermined polarity is imparted, and in which an electrostatic force for attracting the sample is formed; and a bias electrode made of a conductor, the bias electrode being disposed below the dielectric membrane in the sample stage and supplied with radio frequency power for forming a radio frequency bias potential from a radio frequency power supply during the processing of the sample, wherein the plurality of electrodes includes a first electrode to which a positive polarity is imparted and a second electrode to which a negative polarity is imparted based on the DC power, wherein the first electrode is electrically connected to a positive electrode terminal of the DC power supply via the first low pass filter circuit, and wherein the second electrode is electrically connected to a negative electrode terminal of the DC power supply through the second low pass filter circuit, and wherein power supply paths of the DC power between the first electrode and the positive electrode terminal of the DC power supply and between the second electrode and the negative electrode terminal of the DC power supply are not electrically connected to ground so that the positive electrode terminal and the negative electrode terminal of the DC power supply, and the plurality of electrodes, are brought into an electrically floating state during processing of the sample.

According to a representative embodiment of the present invention, it is possible to provide a plasma processing apparatus capable of improving processing yield.

DESCRIPTION OF THE PREFERRED EMBODIMENTS

Figure 1:
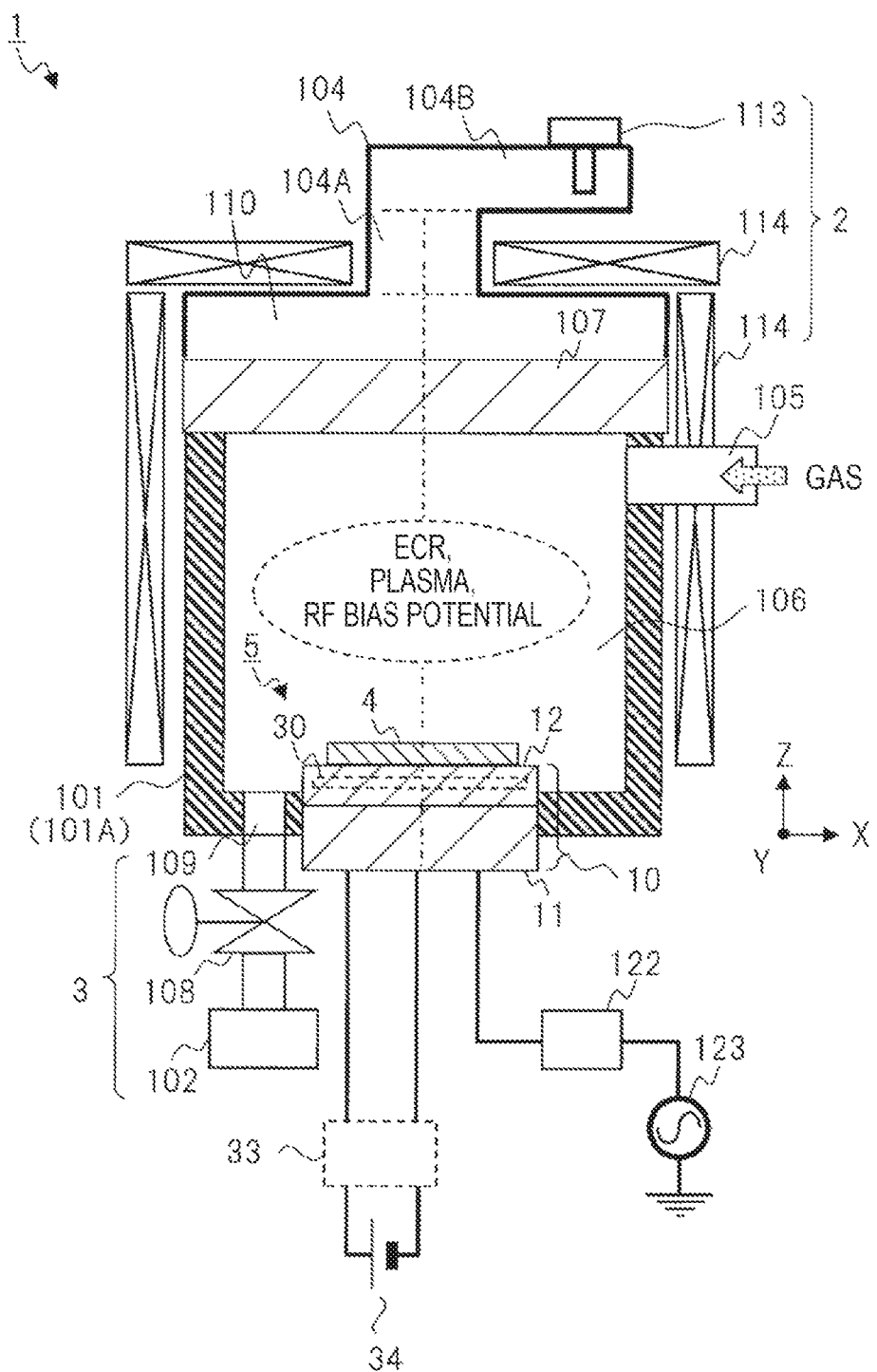
FIG. 1 is a vertical cross-sectional view schematically showing an outline of a configuration of a plasma processing apparatus according to a first embodiment of the present invention.

Hereinafter, embodiments of the present invention will be described in detail with reference to the drawings. In all the drawings for explaining the embodiments, the same reference numerals are attached in principle to the same parts, and a repeated description thereof will be omitted. In the drawings, cross-section hatching may be omitted for the sake of clarity. In the drawings, dimensions, shapes, and the like of the constituent elements are schematically shown as schematic diagrams, and they are not limited to the illustrated dimensions and the like. For the sake of explanation, X direction, Y direction, and Z direction are used as directions. The Z direction is the vertical direction, the height direction, the thickness direction, and the direction in which the center axis of the sample stage or the like extends. The X direction and the Y direction are two directions constituting the horizontal plane and correspond to the radial direction of the sample stage or the like.

[Problems and the Like]

Prerequisite technologies, problems, etc. will be supplementarily explained below. In the above-described prior art, problems have arisen because consideration on the following points is insufficient. In recent years, in the process of manufacturing a semiconductor device using a plasma processing apparatus, a multi-step etching process using a radio frequency bias technique or an ESC technique is mainly offered in order to process the membrane structure, etc. of the upper surface of a sample such as a semiconductor wafer with higher accuracy. In this multi-step etching process, the process condition is switched for each step of a plurality of steps constituting the process. Processing conditions include conditions for discharge of plasma formed by supplying a gas to the interior of the vacuum vessel and the magnitude of an RF bias potential formed by supplying radio frequency power (RF power) to the sample stage or sample (radio frequency: RF).

In such a process, there is a case where the voltage Vdc of the DC component of the RF bias potential due to the RF power varies greatly between steps performed consecutively. For example, in the technical example of JP H10-150100 A, when the voltage Vdc fluctuates, the potential difference between the sample and the sample stage fluctuates, so that the amount of electric charge stored therebetween fluctuates greatly.

Figure 17:
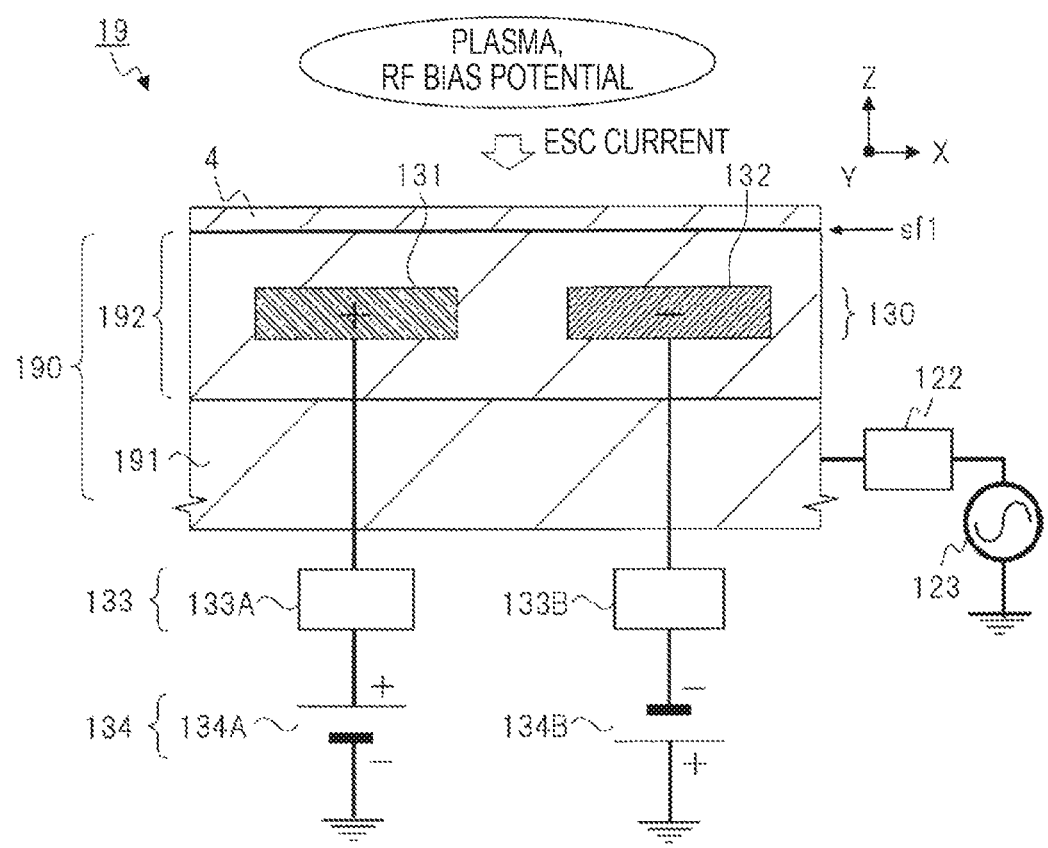
FIG. 17 is a vertical cross-sectional view schematically showing a configuration outline of a sample stage and an ESC system in a plasma processing apparatus of a first comparative example with respect to the embodiment.

With reference to FIG. 17, the ESC system of the plasma processing apparatus of the comparative example to the embodiment will be described as a prior art example corresponding to the above-mentioned JP H10-150100 A. FIG. 17 is a vertical cross-sectional view schematically showing the configuration outline of the ESC system and the sample stage of the plasma processing apparatus of the first comparative example. A vertical cross section (X-Z plane) of a sample stage 190 and the like is shown. An ESC system 19 is a bipolar ESC system. In the ESC system 19 of the first comparative example, the sample stage 190 includes a metal ESC base metal 191 and a dielectric membrane (dielectric member) 192 disposed on the upper surface of the ESC base metal 191. The ESC base metal 191 is a bias electrode to which RF bias electric power from an RF power supply 123 is applied. The dielectric membrane 192 is made of a ceramic material. A state where a sample 4 is placed on the upper surface (that is, a placement surface sf1) of the sample stage 190 and the dielectric membrane 192 is shown. The sample 4 is, for example, a disk-shaped semiconductor wafer.

A plurality of electrodes 130, which is electrodes for the ESC (ESC electrode), is embedded in portion of the dielectric membrane 192. The electrode 130 is a membrane electrode having a predetermined thickness. The plurality of electrodes 130 has a pair of electrodes composed of an electrode 131 (first electrode) and an electrode 132 (second electrode). One electrode 131 is imparted the positive polarity (+), and the other electrode 132 is imparted the negative polarity (−). The two electrodes 131 and 132 are disposed at the same position in the thickness direction and away from each other with a predetermined distance.

The ESC base metal (bias electrode) 191 is electrically connected to a radio frequency power supply (RF power supply) 123 of a predetermined frequency via a matching unit 122. RF power from the RF power supply 123 is supplied to the ESC base metal 191 during processing of the sample 4 held on the dielectric membrane 192. By the RF power, an RF bias potential is formed above the upper surface of the sample 4.

The ESC system 19 includes a first DC power supply 134A and a second DC power supply 134B (DC: direct current) as two DC power supplies (DC power supplies) 134 disposed outside the sample stage 190. The two DC power supplies 134 are electrically connected to the corresponding electrodes 131 and 132 via corresponding low pass filters (LPF) 133, respectively. The LPF 133 includes a first LPF 133A and a second LPF 133B. The electrode 131 is connected to the first DC power supply 134A via the first LPF 133A. The electrode 132 is connected to the second DC power supply 134B via the second LPF 133B.

One output terminal of each of the two DC power supplies 134 is grounded, and the other output terminal is electrically connected to the corresponding electrode 131 and 132 via the LPF 133. The negative electrode terminal of the first DC power supply 134A is grounded, and the positive electrode terminal is connected to the electrode 131 via the first LPF 133A. The positive electrode terminal of the second DC power supply 134B is grounded, and the negative electrode terminal is connected to the electrode 132 via the second LPF 133B. The DC voltage is supplied from the DC power supply 134 to the electrode 130 via the LPF 133. As a result, the two electrodes 131 and 132 are imparted different polarities of the positive electrode and the negative electrode. That is, at the time of electrostatic attraction, the electrode 131 functions as a positive electrode to which the positive polarity is imparted, and the electrode 132 functions as the negative electrode to which the negative polarity is imparted. An electrostatic force is generated inside the dielectric membrane 192 and the sample 4 based on the electric charge between the positive electrode 131 and the negative electrode 132.

In the ESC system 19, in a state where the sample 4 is placed on the placement surface sf1, the sample 4 is attracted to the placement surface sf1 by the electrostatic force formed by using the ESC electrode 130 (131, 132). In this state, processing using plasma is performed on the sample 4.

In such a configuration of the ESC system 19, the variation in the amount of electric charge stored as ESC by the positive and negative electrodes 131 and 132 is supplied as a current (ESC current) flowing from the plasma to the sample 4. The magnitude of this ESC current (referred to as J0) is expressed by the following Equation 1. As the amount of change in the voltage Vdc between the steps of the multi-steps increases, a large value of the ESC current flows at the time of step change. In Equation 1, Cesc represents the capacitance of the portion of the dielectric membrane 192 between the ESC electrode 130 (131, 132) and the sample 4. dVdc/dt represents the time differentiation of the voltage Vdc.

[Math. 1]

$$J_o = C_{esc} \frac{dV_{dc}}{dt} \qquad \text{Equation 1}$$

Figure 2:
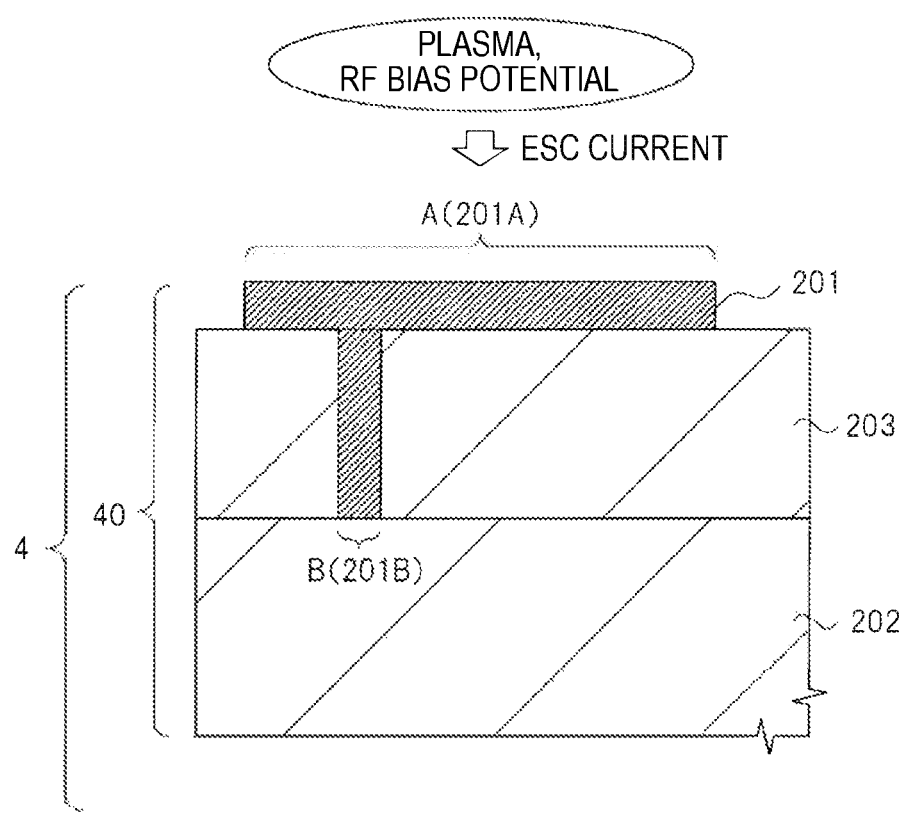
FIG. 2 is a vertical cross-sectional view schematically showing an outline of a configuration example of a membrane structure on an upper surface of a sample in a plasma processing apparatus of an embodiment and a comparative example.

Here, consider the case where a membrane structure 40 on the upper surface of the sample 4 as shown in FIG. 2 is exposed to plasma during processing of the sample 4 using the ESC system 19 of the first comparative example. FIG. 2 is a vertical cross-sectional view schematically showing an outline of a configuration example of a membrane structure on the upper surface of the sample 4 to be processed in the embodiment and the comparative example. The membrane structure 40 of FIG. 2 has a substrate 202, an insulating film 203, and a conductor 201 in order from below. The conductor 201 has a portion A (membrane portion 201A) and a portion B (through hole portion 201B).

The ratio (antenna ratio) between the surface area of the portion A (membrane portion 201A) facing the plasma and the area of the portion B (through hole portion 201B) in the through hole in the conductor 201 is examined. When the antenna ratio is larger than a predetermined value, the ESC current concentrates in the portion B (through hole portion 201B) and may damage the membrane structure 40

In the technique of JP H10-150100 A, any output terminal of the DC power supply is brought to a floating potential. Therefore, even when the voltage Vdc fluctuates, the potentials of the ESC electrode and the DC power supply fluctuate so that a large current does not flow in the DC power supply. Therefore, even when the voltage Vdc fluctuates between the steps of the multi-steps, it is expected that a large ESC current does not flow in the sample. However, in this technique, both output terminals of the DC power supply are directly connected to the positive electrode and the negative electrode of the ESC electrode. Therefore, when the RF power for forming the RF bias is supplied to the sample stage, the RF power leaks to the DC power supply and flows. As a result, the DC power supply generates heat and, in turn, a failure occurs.

JP 2000-507745 A describes a technical example relating to prevention of instability of electrostatic attraction force of the ESC. In the technique of JP 2000-507745 A, positive and negative voltages are applied via a radio frequency filter to the ESC electrode from a DC power supply whose output terminals are not grounded. Further, the voltage Vdc predicted from the magnitude of the amplitude of the radio frequency voltage (referred to as a voltage Vpp) generated on the sample stage is connected to the output terminal of the DC power supply via the resistor circuit. The predicted potential of the voltage Vdc is set to be the intermediate potential between both output terminals of the DC power supply. As a result, the electric power supplied to the ESC electrode is adjusted depending on the variation of the voltage Vdc to adjust the amount of electric charge to be generated.

In the technique of JP 2000-507745 A, prediction of the voltage Vdc is an issue. According to the study of the present inventors, the value of the voltage Vdc does not necessarily have a constant correlation with the value of the voltage Vpp. Therefore, practically, it is difficult to accurately predict the value of the voltage Vdc from the value of the voltage Vpp. Furthermore, there is a time lag between the change (temporal change) in the voltage Vpp with respect to time and the temporal change in the voltage Vdc. Therefore, if inclusive of the transient state, prediction of fluctuation in the voltage Vdc is even more difficult.

Furthermore, also in the configuration of the first comparative example (FIG. 17), when the magnitude of the RF bias power is larger than the predetermined value between temporally consecutive steps, a large ESC current transiently flows into the sample 4 at the time of step change. Therefore, when there is a membrane structure 40 having a large antenna ratio as described above, the sample 4 is damaged. As a result, the performance of the semiconductor device manufactured by performing the process using the plasma is impaired, and there is a problem that the processing yield is lowered. Such a problem has not been considered in the prior art example. The plasma processing apparatus according to the first embodiment has a configuration including an ESC system devised in consideration of the above problem. This improves the processing yield.

First Embodiment

A plasma processing apparatus according to a first embodiment of the present invention will be described with reference to FIGS. 1 to 12. The plasma processing apparatus according to the first embodiment includes a sample stage disposed below the inside of the processing chamber and on which a sample is placed, a dielectric member forming an upper surface portion of the sample stage, a plurality of electrodes (ESC electrodes) for electrostatic attraction (ESC) which is disposed in the dielectric member, and to which DC power is supplied from a DC power supply and is imparted a predetermined polarity to form an electrostatic force for attracting the sample, and a bias electrode (ESC base metal) made of a conductor which is disposed below the dielectric member in the sample stage and to which radio frequency power is supplied from a radio frequency power supply for forming a bias potential during sample processing. The two electrodes (first electrode and the second electrode) of the plurality of electrodes are electrically connected to the positive electrode terminal and the negative electrode terminal of the DC power supply through a low pass filter circuit.

[Plasma Processing Apparatus]

Figure 3:
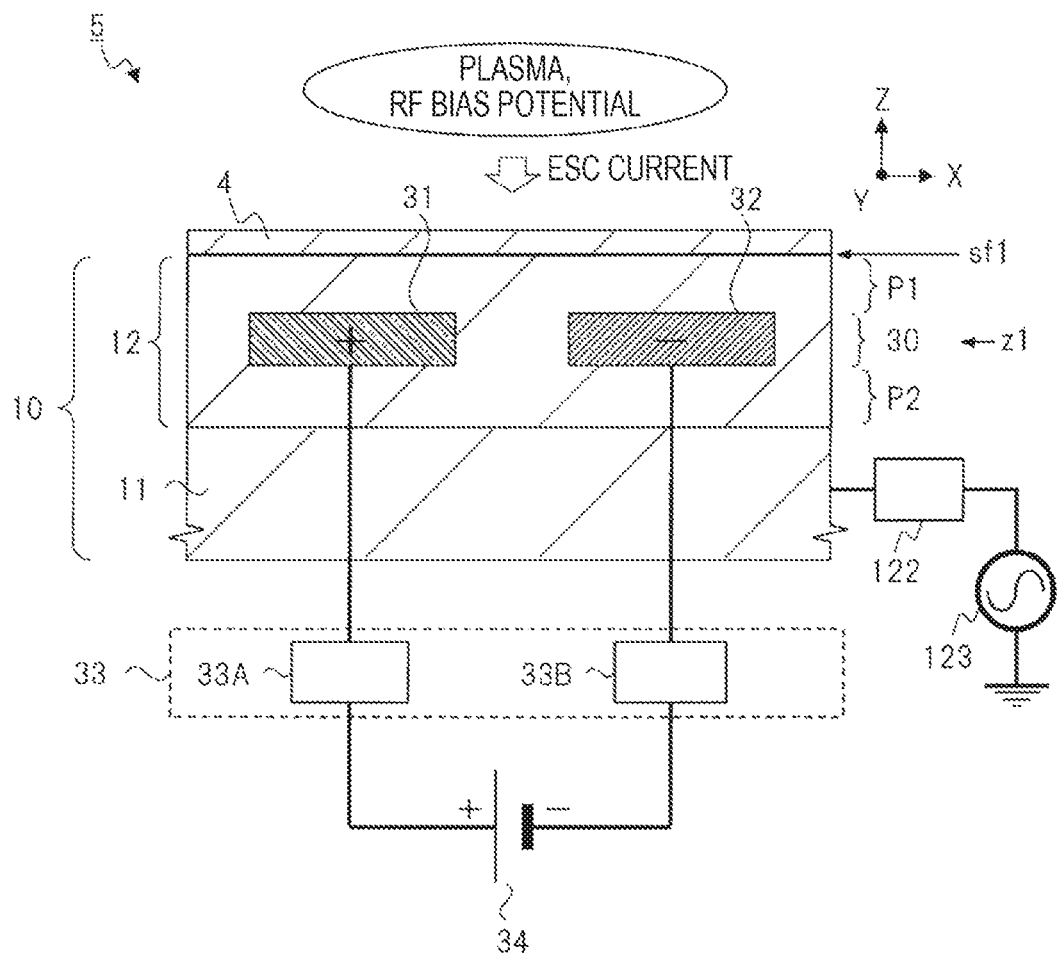
FIG. 3 is a vertical cross-sectional view schematically showing the outline of the configuration of a sample stage and an ESC system in the plasma processing apparatus of the first embodiment.

FIG. 1 is a vertical cross-sectional view schematically showing the configuration outline of a plasma processing apparatus 1 according to the first embodiment. A vacuum vessel 101 and the like are shown in the vertical cross section (X-Z plane). FIG. 3 shows the configuration of an ESC system 5, a sample stage 10, and the like in the plasma processing apparatus 1. The plasma processing apparatus 1 of the first embodiment is a microwave ECR plasma processing apparatus. The microwave ECR supplies an electric field of a microwave having a predetermined frequency and a magnetic field whose intensity is adjusted according to the frequency to the processing chamber 106 disposed in the vacuum vessel 101 and decompressed, and uses electron cyclotron resonance (ECR) which is generated by the mutual interaction. In this method, plasma is generated by exciting gas for plasma formation supplied to the processing chamber 106 by using ECR, and the film layer to be processed in the sample 4 on the sample stage 10 is etched. The sample 4 is a substrate shaped sample to be processed using plasma and is, for example, a disk-shaped semiconductor wafer. The sample 4 is placed on a sample stage 10 disposed in the lower part of a processing chamber 106 and held by the ESC system 5. The etching process includes processing of a film layer to be processed in a multilayer membrane structure including a mask on the surface of the sample 4 and a film layer to be processed.

The plasma processing apparatus 1 of FIG. 1 roughly includes the vacuum vessel 101, an electromagnetic field forming unit 2, and a vacuum exhaust unit 3. The vacuum vessel 101 has the processing chamber 106 in which plasma is formed. The vacuum vessel 101 and the like have an axially symmetrical shape such as cylinders or cylinders with respect to the center axis (indicated by the dashed line) in the vertical direction (Z direction).

The electromagnetic field forming unit 2 is disposed at the surroundings of the upper portion or the side portion of the upper part of the vacuum vessel 101, and generates the electric field and the magnetic field of the ECR. The electromagnetic field forming unit 2 is composed of, for example, a magnetron 113, a plurality of solenoid coils 114, and the like.

The vacuum exhaust unit 3 has an exhaust port 109, a vacuum pump 102, an exhaust control valve 108, and the like. The vacuum pump 102 is disposed below the bottom surface of the vacuum vessel 101 and includes a turbomolecular pump that communicates with the processing chamber 106 through the exhaust port 109 to exhaust the gas.

The vacuum vessel 101 has a cylindrical side wall portion 101A in a part including a portion that surrounds the outer circumference of the processing chamber 106 where at least the plasma is formed. A window member 107 is provided above the upper end portion of the side wall portion 101A of the vacuum vessel 101 and above the processing chamber 106. The window member 107 is a disk-like (or columnar) member made of a dielectric material such as quartz through which an electric field is transmitted. The window member 107 has a planar shape of a circle or an approximate circle which can be regarded as a circle in planar view as viewed from the Z direction. The window member 107 is placed on the side wall portion 101A with a sealing member (not shown) such as an O-ring or the like for hermetically sealing the inside and the outside of the processing chamber 106, constituting a lid member on the top of the vacuum vessel 101.

A gas introduction pipe 105 is connected to part of the side wall portion 101A of the vacuum vessel 101. A gas (processing gas) supplied to the inside in the processing chamber 106 from the upper portion flows in the gas introduction pipe 105.

The sample stage 10 is disposed along the center axis position in the lower part of the inside of the processing chamber 106. The sample stage 10 has a shape of a circle or an approximate circle which can be regarded as a circle in planar view as viewed from the Z direction, for example, has a columnar shape or a disk shape. The sample 4 is placed on the upper surface of the sample stage 10 through a transfer robot which will be described later.

As also shown in FIG. 3, the sample stage 10 has an ESC base metal (bias electrode) 11 which is the lower part of the sample stage 10 in the Z direction and a dielectric membrane 12 connected and disposed on the ESC base metal 11. The ESC base metal 11 has a circular plate or cylindrical shape with a predetermined thickness and diameter, is made of a member made of a conductor such as a metal, and is a bias electrode to which RF power is applied. As in the ESC base metal 11, the dielectric membrane 12 has a circular or cylindrical shape with a predetermined thickness and diameter, and is made of a substantially film-shaped member made of dielectric (dielectric member) covering the upper surface of the ESC base metal 11. The dielectric membrane 12 constitutes the upper surface portion of the sample stage 10 and has a placement surface sf1 on which the sample 4 is placed. A plurality of electrodes 30 is embedded as the membrane ESC electrode in the dielectric membrane 12.

The ESC base metal 11 is electrically connected to a radio frequency power supply (RF power supply) 123 disposed outside the sample stage 10 via the matching unit 122 by a power supply path. The RF power supply 123 outputs a radio frequency power (RF power) of a predetermined frequency. During processing of the sample 4, the RF power from the RF power supply 123 is supplied to the ESC base metal (bias electrode) 11 via the matching unit 122. As a result, an RF bias potential is generated above the upper surface of the sample 4 through the ESC base metal 11 and the dielectric membrane 12.

A waveguide 104, which is a path through which an electric field of microwave propagates through a hollow portion 110, is disposed above the window member 107. The magnetron 113, which oscillates and generates an electric field of microwaves, is disposed at one end of the upper portion (rectangular waveguide portion 104B) of the waveguide 104. The waveguide 104 has a circular waveguide portion 104A and the rectangular waveguide portion 104B. The circular waveguide portion 104A extends in the Z direction and has a circular cross section. The rectangular waveguide portion 104B is disposed and connected above the circular waveguide portion 104A, and extends in one direction (X direction) in the horizontal direction, and has a rectangular or a squarer cross section. The other end portion of the rectangular waveguide portion 104B is connected to the upper end of the circular waveguide portion 104A. The diameter of the circular waveguide portion 104A is smaller than the diameter of the window member 107.

The hollow portion 110 is provided between the window member 107 and the waveguide 104 (circular waveguide portion 104A). The hollow portion 110 is a cavity through which the microwave is propagated, has a substantially the same diameter as the vacuum vessel 101 and the window member 107, and has a cylindrical shape having a predetermined height. The opening at the lower end of the circular waveguide portion 104A is connected in communication with the opening of the center axis of the top surface portion of the hollow portion 110. The lower surface of the hollow portion 110 corresponds to the upper surface of the window member 107.

Further, in the electromagnetic field forming unit 2, solenoid coils 114 wound in a plurality of stages are disposed as the plurality of solenoid coils 114. The plurality of solenoid coils 114 include a solenoid coil 114 disposed above the top surface portion of the hollow portion 110 and around the side wall of the circular waveguide portion 104A, and a solenoid coil 114 surrounding the outer periphery of the hollow portion 110, the window member 107, and the side wall portion 101A of the vacuum vessel 101. DC power is supplied to the solenoid coil 114, and a magnetic field of a predetermined strength is formed. This magnetic field of the predetermined intensity is a magnetic field of intensity matching the frequency of the microwave that is generated by the magnetron 113 and propagates in the waveguide 104.

The vacuum exhaust unit 3 is provided with the exhaust port 109, as part of the bottom portion of the vacuum vessel 101, which is disposed at a position lower than the upper surface of the sample stage 10. The exhaust port 109 communicates the inside and the outside of the processing chamber 106, and gas and particles therein are discharged. The exhaust port 109 is connected to the exhaust control valve 108 and the vacuum pump 102 through an exhaust pipe. The vacuum pump 102 is constituted by a turbomolecular pump. The exhaust control valve 108 is disposed on the way of an exhaust pipe connecting the exhaust port 109 and the vacuum pump 102. The exhaust control valve 108 increases or decreases the flow path cross-sectional area inside the exhaust pipe to increase or decrease the flow rate and speed of the gas or plasma particles passing through the exhaust pipe. A roughing pump such as a rotary pump (not shown) is connected and disposed on the downstream side of the turbomolecular pump of the vacuum pump 102. This pump serves to discharge the exhausted particles and the like out of a building such as a clean room where the plasma processing apparatus 1 is disposed.

A vacuum transfer container is connected to the side wall portion 101A of the vacuum vessel 101. The vacuum transfer container is another vacuum vessel (not shown), and has a transfer chamber which is a depressurized space inside. A transfer robot is disposed inside the transfer chamber. The transfer robot includes an arm portion including a plurality of arms rotatably connected at both end portions and configured to be expandable and contractible. The sample 4 is placed on the upper surface of the tip portion of the arm portion of the transfer robot and held and transported. Further, a passage through which the sample 4 placed on the arm portion of the transfer robot is transported inside is disposed on the side wall portion 101A. At the same time, the side wall portion 101A is connected to the vacuum transfer container so that the gate, which is the opening of the passage on the transfer chamber side, is airtightly partitioned from the inside and outside including the space around the gate.

The sample 4 held at the tip portion of the arm portion of the transfer robot is transported from inside the transfer chamber to above the sample stage 10 in the processing chamber 106 in the vacuum vessel 101 through the gate of the passage. Then, the sample 4 is delivered to the sample stage 10. Specifically, although not shown in the figure, the sample stage 10 has a plurality of through holes penetrating the ESC base metal 11 and the dielectric membrane 12, and a plurality of pusher pins disposed in the plurality of through holes. Upon delivery, a plurality of pusher pins is driven upward to pick up and receive the sample 4 held at the tip portion of the arm portion of the transfer robot. Thereafter, the arm portion of the transfer robot contracts and retreats from the processing chamber 106 into the transfer chamber. As a result, the sample 4 is delivered to the sample stage 10. Thereafter, in a state where the sample 4 is placed on the tip portion of the plurality of pusher pins, the plurality of pusher pins is driven downward and stored in the through hole. Then, the sample 4 is placed on the upper surface of the dielectric membrane 12 of the sample stage 10 (placement surface sf1).

In this state, the DC power from the DC power supply 34 is supplied to the ESC electrode 30 disposed in the dielectric membrane 12, and an electrostatic force is generated. By the electrostatic force, the sample 4 is attracted to and held on the upper surface of the dielectric membrane 12.

At the same time, the processing gas diluted with the rare gas is introduced into the processing chamber 106 through the gas introduction pipe 105. The pressure inside the processing chamber 106 is controlled by the balance between the flow rate and the speed of the processing gas from the gas introduction pipe 105 and the flow rate and the speed of the exhaust gas from the exhaust port 109, and is adjusted to a value within the range which is suitable for starting the plasma-generated processing.

On the other hand, a microwave electric field of, for example, 2.45 GHz, oscillated by the magnetron 113 propagates through the waveguide 104 and the hollow portion 110, transmits through the window member 107, and is supplied into the processing chamber 106. At the same time, the magnetic field generated by the solenoid coil 114 based on the DC power is supplied into the processing chamber 106. The ECR is generated by the interaction between the electric field and the magnetic field. By the ECR, atoms or molecules of the processing gas are excited, and ionized or dissociated, and plasma is generated in the discharge space above the sample stage 10 in the processing chamber 106.

Thereafter, the RF power from the RF power supply 123 is supplied to the ESC base metal 11, and the RF bias potential is formed above the sample 4 held on the upper surface of the dielectric membrane 12 of the sample stage 10. Charged particles such as ions in the plasma are attracted toward the upper surface of the sample 4 according to the potential difference between the RF bias potential and the plasma. The charged particles collide with the film to be processed in the membrane structure of the sample 4 and the etching process of the film is promoted.

[Membrane Structure of Upper Surface of Sample]

FIG. 2 shows a configuration example of a membrane structure of the upper surface of the sample 4 to be etched in the plasma processing apparatus 1 of the first embodiment. The membrane structure 40 of FIG. 2 includes the substrate 202 which can be regarded as a conductor, the insulating film 203 which is connected to and disposed on the upper surface of the substrate 202, and a conductor 201 which is provided on part of the insulating film 203. The conductor 201 has a portion A (membrane portion 201A) and a portion B (through hole portion 201B). The portion B (through hole portion 201B) is a portion with which the through hole penetrating the insulating film 203 in the thickness direction is filled and is in contact with part of the upper surface of the substrate 202. The portion A (membrane portion 201A) is a part covering part of the upper surface of the insulating film 203 around the opening on the upper end of the through hole in the portion B in a film shape.

[ESC System]

FIG. 3 is a vertical cross-sectional view schematically showing the configuration outline of the sample stage 10 including the ESC system 5 in the plasma processing apparatus 1 according to the first embodiment. The X-Z plane of the sample stage 10 and the like is shown. The X direction is one direction in the radial direction with respect to the center axis (Z direction).

In the plasma processing apparatus 1 according to the first embodiment, the ESC system 5 is mainly configured in the upper portion of the sample stage 10 (including the placement surface sf1 which is the upper surface of the dielectric membrane 12). The ESC system 5 includes a plurality of electrodes 30 in the dielectric membrane 12, a low pass filter (LPF) 33 electrically connected to each of the plurality of electrodes 30 through a power supply path (electrical wiring), and a direct current power supply (DC power supply) 34 electrically connected to the LPF 33 through a power supply path.

The dielectric membrane 12 is a dielectric member made of a ceramic material such as aluminum oxide or yttrium oxide disposed to cover the upper surface of the upper part of the ESC base metal 11. The sample stage 10 and the dielectric membrane 12 have a placement surface sf1, which is an upper surface, and the sample 4 is placed on the placement surface sf1.

The plurality of electrodes 30, which is the ESC electrode, is a plurality of film-shaped electrodes made of metal such as tungsten where the electrodes 30 are embedded in portion of the dielectric membrane 12. The plurality of electrodes 30 has a pair of electrodes composed of an electrode 31 (first electrode) and an electrode 32 (second electrode). The plurality of electrodes 30 is disposed at the same position (predetermined position z1) in the thickness direction (Z direction) and is disposed away from each other at a predetermined distance in the X direction. The film of the electrode 30 has a predetermined thickness (distance in the Z direction). Different polarities (positive polarity, negative polarity) are imparted to the plurality of electrodes 30 by the supply of the DC voltage from the DC power supply 34. At the time of the ESC, the positive polarity is imparted to the electrode 31 and the negative polarity is imparted to the electrode 32. Each of the plurality of electrodes 30 is connected to a terminal of a corresponding polarity (positive electrode terminal, negative electrode terminal) of the DC power supply 34 via the LPF 33, and is imparted respective polarities.

The LPF 33 includes a first LPF 33A and a second LPF 33B. The electrode 31 is connected to the positive electrode terminal of the DC power supply 34 in an electrode-like manner via the first LPF 33A. The electrode 32 is connected to the negative electrode terminal of the DC power supply 34 in an electrode-like manner via the second LPF 33B.

In the first embodiment, the two output terminals (positive electrode terminal and the negative electrode terminal) of the DC power supply 34 are not grounded, and are brought to an electrically floating potential at least during the processing of the sample 4. Also, at least during the processing of the sample 4, each of the electrodes 30 (electrodes 31, 32) is also brought to an electrically floating potential.

The dielectric membrane 12 includes, as a schematic part, in the Z direction, a portion including the plurality of electrodes 30 (a portion between the upper surface of the electrode 30 and the lower surface of the electrode 30), a first portion P1 between the upper surface of the plurality of electrodes 30 and the lower surface (placement surface sf1) of the sample 4, and a second portion P2 between the lower surface of the plurality of electrodes 30 and the upper surface of the ESC base metal 11. The first portion P1 and the second portion P2 each have a predetermined thickness (distance in the Z direction).

In the first embodiment, the dielectric membrane 12 in the sample stage 10 and the ESC base metal 11 below the electrode 30 are, in other words, a bias electrode made of a conductor, to which the RF power for forming the RF bias potential formation is supplied from the RF power supply 123.

The shape and position of the ESC electrode 30 in the X-Y plane of the sample stage 10 in planar view in the Z direction is not particularly limited, but it is, for example, as follows. When viewing the circular region on the upper surface of the sample stage 10 in planar view, one of the positive and negative electrodes 31 and 32 of the plurality of electrodes 30 is disposed in the circular region near the center axis and the other is disposed in the outer peripheral ring region. In another example, the positive and negative electrodes 31 and 32 are each disposed in the inner peripheral ring area and the outer peripheral ring area. In another example, the positive and negative electrodes 31 and 32 are disposed in a double spiral shape. In addition, the positive and negative electrodes 31 and 32 may be separated into a plurality of electrode portions in the circumferential direction.

[Etching Process]

The etching process of the sample 4 using the plasma processing apparatus 1 including the ESC system 5 and the sample stage 10 as described above will be described below. In the first embodiment, as an example, the membrane structure 40 on the upper surface of the sample 4 in FIG. 2 is subjected to the etching process. The etching process of the membrane structure 40 of the sample 4 will be described with reference to FIGS. 4 to 7 and the like. This etching process is a multi-step etching process including the following first step S1, second step S2, and third step S3. In this etching process, the magnitude of the RF bias potential and the like are switched for each step (corresponding process, time). As a result, the voltage Vdc, etc. of the DC component applied to the sample 4 can fluctuate between steps and every step.

At the first step S1 (time T1 in FIG. 4), a gas in which $SF_6$ (sulfur hexafluoride) and $CHF_3$ (trifluoromethane) are mixed is supplied as a processing gas into the processing chamber 106 to form plasma, an RF power of 150 W is supplied to the ESC base metal 11 to form an RF bias potential, and the sample 4 is processed for 30 seconds (s).

Next, in the second step S2 (time T2), a plasma is generated using a processing gas in which $Cl_2$ (chlorine gas), HBr (hydrogen bromide), and $O_2$ (oxygen) are mixed, and the RF bias potential by an RF power of 30 W is formed, and the sample 4 is processed for 30 seconds.

Furthermore, in the third step S3 (time T3) which is the final step, plasma is generated using a processing gas in which HBr and $O_2$ are mixed and using the RF bias potential by RF power of 300 W, the sample 4 is processed for 30 seconds.

During the processing of the above plurality of steps, the voltage of the power output from the DC power supply 34 is set to have its amplitude fixed to 1200 V.

ESC Current—First Embodiment

Figure 4:
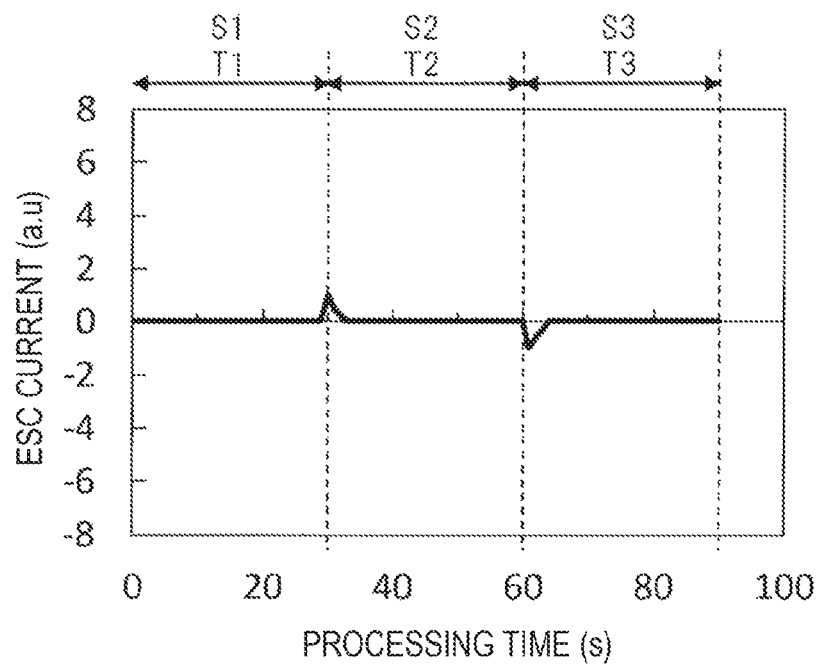
FIG. 4 is a graph showing a temporal change of an ESC current flowing into a sample when the membrane structure of FIG. 2 is processed in the plasma processing apparatus of the first embodiment.

FIG. 4 shows a graph representing the temporal change in the ESC current flowing into the sample 4 during the process (etching process) in which the above-described plurality of steps is performed when the plasma processing apparatus 1 according to the first embodiment performs the process on the membrane structure 40 of FIG. 2 using the ESC system 5 and the like of FIG. 3. The horizontal axis is the processing time (second (s)), which represents the first step S1 (time T1), the second step S2 (time T2), and the third step S3 (time T3). The vertical axis shows the magnitude of the ESC current with 0 as the center. In the example of FIG. 4, although a very small ESC current flows during switching and shifting between steps, no damage to the sample 4 due to this processing is observed. That is, in the plasma processing apparatus 1 of the first embodiment, while the sample 4 is attracted and held by the ESC system 5, damage to the sample 4 due to the ESC current during the etching process can also be prevented or suppressed.

ESC Current—Comparative Example (1)

Next, similarly to the membrane structure 40 of FIG. 2, the processing of the plurality of steps will be described using the ESC system 19 of the first comparative example of FIG. 17 instead of the ESC system 5 of the first embodiment of FIG. 3. In the configuration of the ESC system 19 of FIG. 17, the electrode 131 is made positive and the electrode 132 is made negative based on the DC voltage from the DC power supply 134 during the ESC and the processing. During this processing, the output voltage of the DC power supply 134 is set to have its amplitude fixed to 600 V for both positive and negative.

Figure 5:
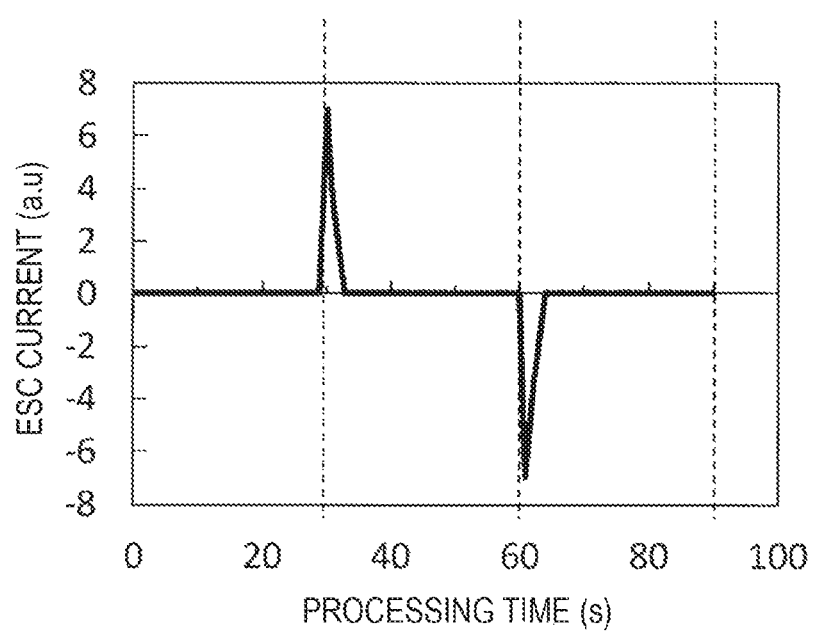
FIG. 5 is a graph showing a temporal change of the ESC current in the case where the membrane structure of FIG. 2 is processed using an ESC system of a first comparative example of FIG. 17.

FIG. 5 is a graph showing a temporal change of the ESC current in the case where the membrane structure 40 of FIG. 2 is processed using the ESC system 19 of the first comparative example of FIG. 17. As shown in FIG. 5, it can be seen that a large ESC current flows before and after the time at which the processing conditions are changed by switching the preceding and succeeding steps. As a result of investigating the processed sample 4, it has been acknowledged that the ESC current concentrates on the film-like portion A of the conductor 201 of the membrane structure 40 of FIG. 2 and the portion B which is in contact with the substrate 202, and due to the heat generated at this time, the portion B is completely melted and disappears, causing damage.

ESC Current—Comparative Example (2)

Next, a case where the above-described processing of the plurality of steps is similarly performed on the membrane structure 40 of FIG. 2 using the bipolar ESC system as the ESC system of the second comparative example will be described. In the ESC system of the second comparative example, corresponding positive and negative voltages are applied to the respective electrodes of the positive electrode and the negative electrode for the ESC electrodes from the DC power supply whose output terminals are not grounded through an RF filter (radio frequency filter).

As a result of this processing, RF noise (radio frequency noise) occurred in the first step and the third step where the amplitude of the RF power for forming the RF bias potential is large, and the control system became unstable. In addition, when this process is repeated, the insulation coating between the output terminal of the DC power supply and the power supply housing is heated and burned.

ESC Current—Comparative Example (3)

Next, a case where the above-described processing of the plurality of steps is similarly performed on the membrane structure 40 of FIG. 2 using the ESC system of the third comparative example will be described. In the ESC system of the third comparative example, corresponding positive and negative voltages are applied to the respective electrodes of the positive electrode and the negative electrode for the ESC electrodes from the DC power supply whose output terminals are not grounded through an RF filter. At the same time, in the ESC system of the third comparative example, the voltage Vdc predicted from the voltage Vpp is connected to the output terminal of the DC power supply via the resistor circuit. As a result, the predicted potential of the voltage Vdc is set to be the intermediate potential between the two output terminals of the DC power supply. The voltage Vpp is the magnitude of the amplitude of the RF voltage generated on the sample stage due to the supply of the RF power for forming the RF bias potential. The voltage Vdc is a voltage of the DC component generated in the sample 4 with the RF power. During this process, the voltage output from the DC power supply is set to be fixed at 1200 V.

Figure 6:
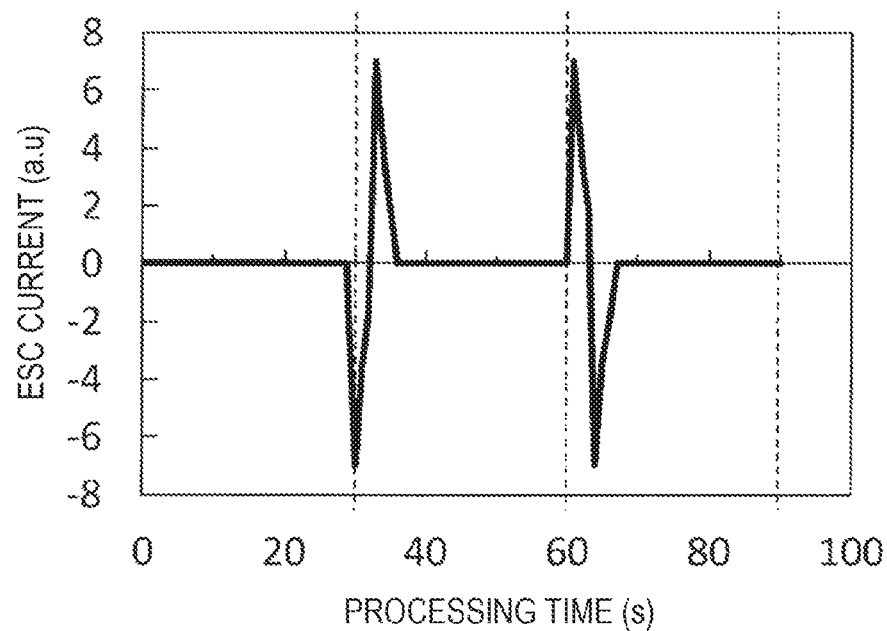
FIG. 6 is a graph showing a temporal change in ESC current in a case where the membrane structure of FIG. 2 is processed using the ESC system of a third comparative example.

FIG. 6 is a graph showing a temporal change of the ESC current in the case where the membrane structure 40 of FIG. 2 is processed using an ESC system of the third comparative example. It has been found that, as shown in FIG. 6, in the first step to the third step, a large ESC current flows on the positive side and the negative side at the timing when the processing conditions change as the steps are switched.

Figure 7:
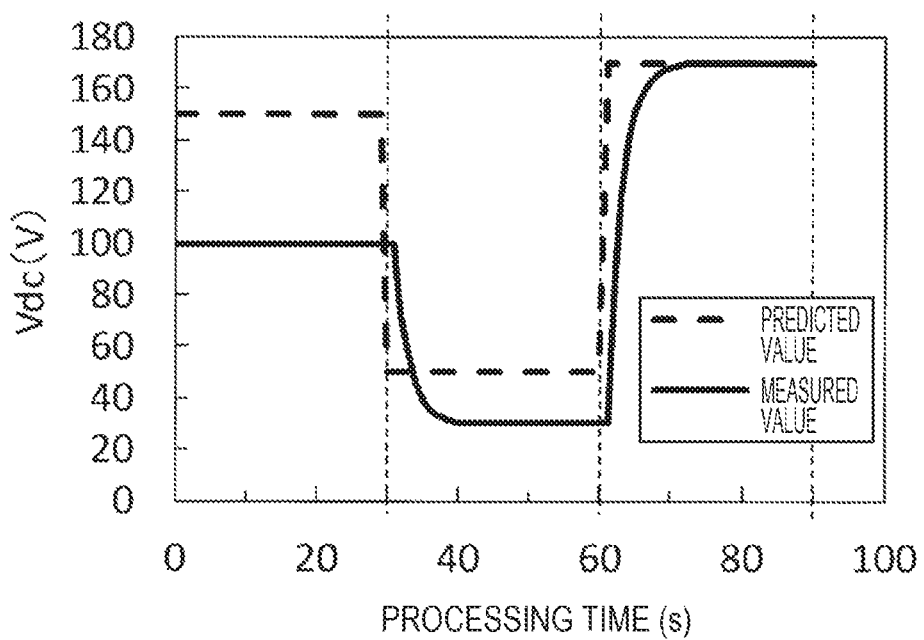
FIG. 7 is a graph showing a temporal change in a predicted value and a detected value of a voltage Vdc during the process of FIG. 6.

Further, FIG. 7 is a graph showing the temporal change in the predicted value of the voltage Vdc and the detected value (actually measured value) of the actual voltage Vdc during the process of FIG. 6. The vertical axis represents the voltage Vdc (V). The solid line indicates the detected value (measured value), and the broken line indicates the predicted value. As shown in FIG. 7, the ratio between the voltage Vpp and the voltage Vdc changes greatly depending on the conditions such as the potential value of the plasma during the processing. Therefore, the predicted value of the voltage Vdc obtained simply by multiplying the voltage Vpp by the coefficient does not match the actual voltage Vdc. That is, simple prediction of the voltage Vdc from the voltage Vpp is difficult. Further, from FIG. 7, it can be seen that there is a delay in the temporal change in the actual voltage Vdc with respect to the temporal change in the predicted value calculated based on the voltage Vpp. It has been found that according to the examination by the present inventors, a large ESC current flows by the time difference between the predicted value of the voltage Vdc and the detected value of the voltage Vdc when the step is switched. Furthermore, in the sample 4 after the process, it has been acknowledged that heat is generated due to the concentration of the current in the portion B (through hole portion 201B), in particular, of the membrane structure 40 in FIG. 2, so that this portion B is melted and disappears, causing damage.

[Effects, Etc. (1-1)]

As described above, the plasma processing apparatus 1 according to the first embodiment supplies the RF power to the ESC base metal 11 serving as a bias electrode in the sample stage 10 on which the sample 4 is placed and which supports the sample 4 to form an RF bias potential and perform the process on the sample 4. Further, in the plasma processing apparatus 1, as the ESC, a positive and negative DC voltage is applied to a plurality of electrodes 30 for ESC in the dielectric membrane 12 from the DC power supply 34 where both output terminals are completely brought to a floating potential through the LPF 33 during the processing of the sample 4. A positive DC voltage is applied to the electrode 31, and is imparted the positive polarity, and a negative DC voltage is applied to the electrode 32, and is imparted the negative polarity. As a result, while the sample 4 is attracted and held during the process, the ESC current flowing from the plasma to the sample 4 with the RF bias potential is suppressed. Thus, in the first embodiment, even in the case of multi-step etching process on the sample 4 having the membrane structure 40 with a large antenna ratio on the upper surface side as shown in FIG. 2, damage to the sample 4 is prevented or suppressed. In the first embodiment, even when the process is performed such that the voltage Vdc due to the RF power for forming the RF bias potential, which is one of the process conditions, greatly fluctuates between the consecutive steps constituting the process, the damage is suppressed.

[ESC System-Equivalent Circuit]

Figure 8:
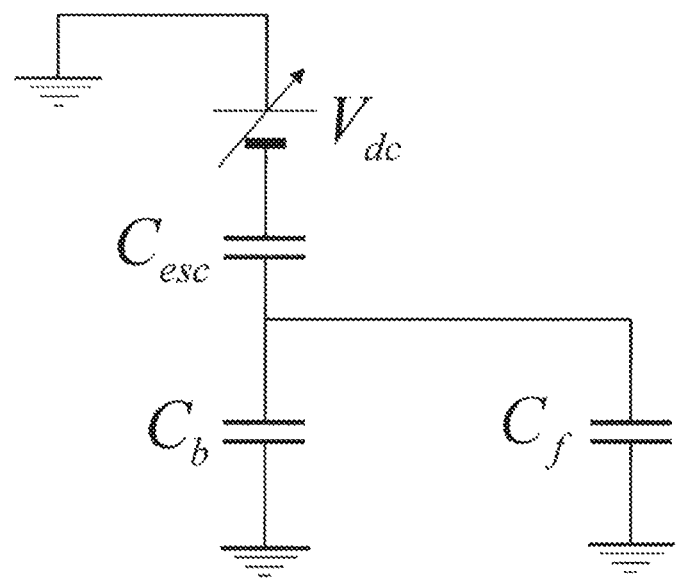
FIG. 8 is a view of an equivalent circuit related to an ESC system and plasma in the first embodiment.

FIG. 8 shows an electrical equivalent circuit including only DC component corresponding to the ESC system 5 including the plasma in FIG. 3 explained in the plasma processing apparatus 1 in the first embodiment. In the equivalent circuit of FIG. 8, a capacitor with a capacitance Cesc is connected to a voltage Vdc of the sample 4, and a capacitor with the capacitance Cb and a capacitor with the capacitance Cf are connected in parallel to the capacitor with the capacitance Cesc. The capacitance Cesc of the capacitor indicates a capacitance of the portion of the dielectric between the ESC electrode and the sample. In FIG. 3, this capacitance Cesc corresponds to the capacitance of the first portion P1 of the dielectric membrane 12 between the upper surface of the electrodes 30 (31, 32) and the rear surface (placement surface sf1) of the sample 4. The capacitance Cb of the capacitor indicates a capacitance of the portion of the dielectric between the ESC electrode and the ESC base metal (bias electrode) of the sample stage. In FIG. 3, this capacitance Cb corresponds to the capacitance of the second portion P2 of the dielectric membrane 12 between the lower surface of the electrodes 30 (31, 32) and the upper surface of the ESC base metal 11. The capacitance Cf the capacitor is a capacitance of the capacitor in the LPF circuit. In FIG. 3, this capacitance Cf is the sum of the capacitance of all the capacitors in the circuit of the LPF 33. In the case where the ESC system 5 includes a plurality of LPF circuits as the LPF 33, for example, a first LPF 33A and a second LPF 33B in FIG. 3, the capacitance Cf is a capacitance of the capacitor when the plurality of LPF circuits are regarded as one circuit as a whole.

During the process in which the plasma is generated and the sample 4 is processed using these parameters, the value J of the ESC current flowing into the sample 4 at the time of switching the consecutive steps in which the RF power for forming the RF bias potential differs is expressed as follows. That is, the value J of the ESC current is expressed by the following Equation 2 using, as a parameter, the ESC current value J0 (Equation 1) in the ESC system 19 of the first comparative example in FIG. 17.

[Math. 2]

$$J = \frac{C_f + C_b}{C_f + C_b + C_{esc}} J_o \quad \text{Equation 2}$$

Figure 9:
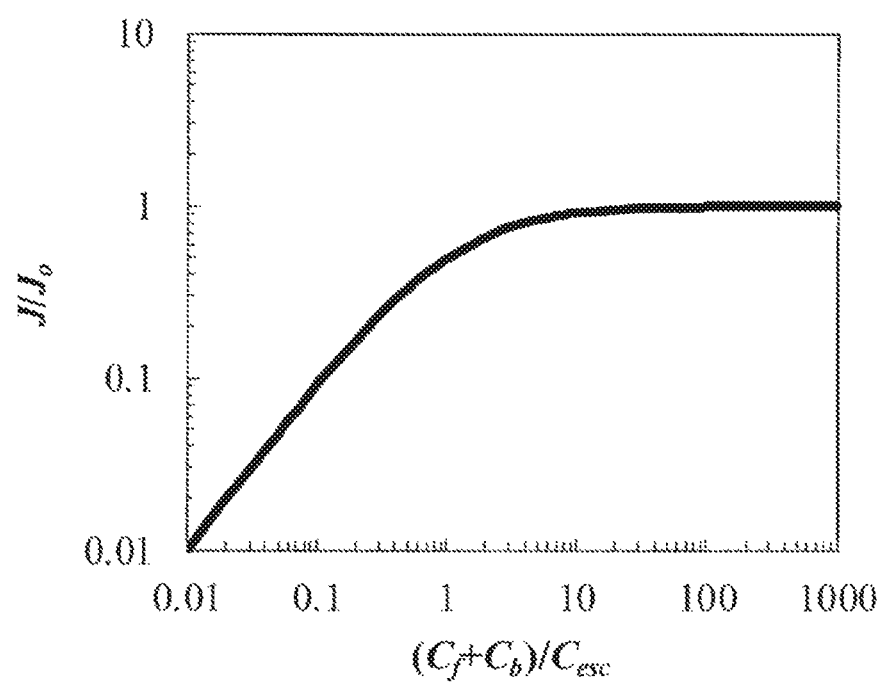
FIG. 9 is a graph showing the relationship of Equation 2 using the ratio of the capacitance and the ratio of the ESC current of Equation 2 as parameters in the first embodiment.

The relationship represented by Equation 2 is shown in FIG. 9. FIG. 9 is a graph representing the relationship of Equation 2 with the capacitance ratio ((Cf+Cb)/Cesc) and ESC current ratio (J/J0) in Equation 2 as parameters.

[ESC-Condition]

From the above, the following conditions are required in order to suppress the ESC current. (1) The capacitance of the portion of the dielectric membrane between the ESC electrode and the sample (capacitance of the first portion P1) is set as a first capacitance C1. The first capacitance C1 corresponds to Cesc. (2) The capacitance of the portion of the dielectric membrane between the ESC electrode and the ESC base metal (capacitance of the second portion P2) is set as a second capacitance C2. The second capacitance C2 corresponds to Cb. (3) The sum of the capacitance of the capacitors in the LPF circuit is set as a third capacitance C3. The third capacitance C3 corresponds to Cf.

As the condition, the sum (C2+C3) of the second capacitance C2 and the third capacitance C3 is set to a value smaller than the first capacitance C1 ((C2+C3)<C1, (Cb+Cf)<Cesc). The ESC system 5 in the first embodiment is set so as to satisfy the above conditions.

In the case of the mounting example of the ESC system 5 used in the first embodiment, the diameter of the sample 4 is, for example, 300 mm. The diameter of the upper surface of the sample stage 10 is equal to or larger than the diameter of the sample 4. The average value of the distance of the portion (first portion P1) between the ESC electrodes 30 (31, 32) and the sample 4 is 0.3 mm. Alumina (aluminum oxide) having a relative dielectric constant of 9.8 is used as a material constituting the dielectric membrane 12. In addition, the capacitance Csec (first capacitance C1) of the capacitor is set to about 20 nF. In the first embodiment, in order to reduce the value of the capacitance Cb (second capacitance C2) of the capacitor, the distance of the portion (second portion P2) between the ESC electrodes 30 (31, 32) and the ESC base metal 11 is set to 2.1 mm. As a result, as a mounting example in the first embodiment, the value of the capacitance Cb (second capacitance C2) is set to 2.9 nF which is about 1/7 of the value of the capacitance Cesc (first capacitance C1). Further, the third capacitance C3 (capacitance Cf) related to the LPF 33 is set as follows.

[LPF Circuit (1)]

Figure 10:
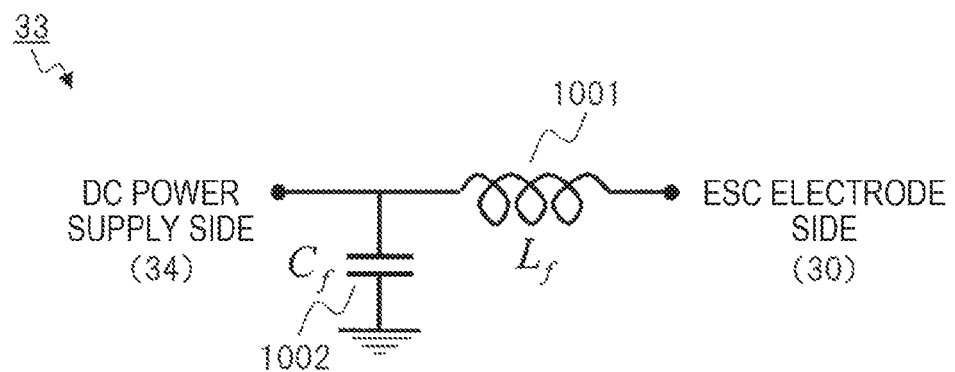
FIG. 10 is a diagram schematically showing a configuration example of an LPF circuit connected to an ESC electrode in the plasma processing apparatus of the first embodiment.

In the first embodiment, the circuit shown in FIG. 10 can be used as a mounting example of the circuit of the LPF 33. FIG. 10 is a circuit diagram schematically showing a configuration example of a circuit of the LPF 33 constituting the ESC system 5 of FIG. 3 in the plasma processing apparatus 1 of the first embodiment. In this circuit, a coil 1001 (inductance: Lf) and a capacitor 1002 are connected between the ESC electrode (electrode 30) and a DC power supply 34. The capacitance of the capacitor 1002 corresponds to the above-mentioned capacitance Cf.

In the configuration example of the circuit of the LPF 33, the attenuation factor of the LPF 33 with respect to the RF power of, for example, 400 kHz used as the RF bias power is set to 30 dB or more. Therefore, the product value (Lf×Cf) of the value of the inductance Lf of the coil 1001 and the value of the capacitance Cf of the capacitor 1002 that determine the attenuation factor is maintained at $5\times10^{-12}$ $s^2$ or more (($Lf\times Cf)\geq 5\times10^{-12}$ $s^2$) In order to reduce the capacitance Cf while maintaining this value (Lf×Cf), a coil 1001 having a relatively large inductance of Lf=20 mH is used. Finally, the capacitance Cf of the capacitor 1002 can be set to 0.25 nF. The capacitance Cf (third capacitance C3) of the LPF 33 satisfies the above condition.

The frequency which is a circuit constant of the LPF circuit (LPF 33) is represented by $\sqrt{(Lf\times Cf)}$. In the first embodiment, the LPF 33 and the RF power supply 123 are electrically connected via constituent elements. As a requirement in this configuration, this circuit constant is made sufficiently smaller than the frequency of the RF power of the RF power supply 123.

In the configuration of FIG. 3 of the first embodiment, the ESC system 5 of the sample stage 10 is provided with two LPF circuits (33A, 33B) having the same configuration as the LPF 33 on the power supply path of each of the two electrodes 31 and 32 as the ESC electrodes 30. Therefore, the capacitance Cf, which is the third capacitance C3 (sum of the capacitance of the capacitors in the LPF), is 0.25 nF×2=0.5 nF.

From this fact, according to the examination by the present inventors, the magnitude of the ESC current estimated from Equation 2 is about 1/7 of the magnitude of the ESC current of the first comparative example. As described above, according to the ESC system 5 of the plasma processing apparatus 1 of the first embodiment, the ESC current flowing in the sample 4 can be remarkably reduced, as shown in FIG. 4, between the steps in which the value of the RF bias power (corresponding voltage Vdc) is different, and the effect of suppressing damage to the sample 4 can be obtained.

[LPF Circuit (2)]

As another comparative example, in order to investigate the influence of the capacitance of the capacitor in the LPF 33, the value of the capacitance in the LPF 33 is set to 25 nF, which is larger than the value of the capacitance Cesc, and the evaluation is conducted for the case where the membrane structure 40 in FIG. 2 is similarly processed. In this case, the capacitance Cf (third capacitance C3), which is the sum of capacitance of the capacitors in the LPF, is 50 nF. In this case, it has been found that the magnitude of the ESC current J estimated by Equation 2 is 75% of the magnitude of the ESC current J0 of the first comparative example. In the process of the membrane structure 40 using the LPF 33, it has been acknowledged that since the ESC current is not sufficiently suppressed, part of the portion B (through hole portion 201B) of the membrane structure 40 disappears, causing damage.

[LPF Circuit (3)]

Next, as another comparative example, in order to investigate the influence of the capacitance of the portion (second portion P2) of the dielectric membrane 12 between the ESC electrodes 30 (31, 32) and the upper surface of the ESC base metal 11, the evaluation is carried out with the following constitution. With this configuration, the distance of the second portion P2 between the electrodes 31 and 32 and the upper surface of the ESC base metal 11 is set to 0.1 mm. With this configuration, as in the mounting example of the LPF 33 of the first embodiment, the evaluation is carried out on the case where the membrane structure 40 of FIG. 2 is processed. At this time, the capacitance Cb (second capacitance C2) of the portion of the dielectric membrane 12 between the electrodes 31 and 32 and the upper surface of the ESC base metal 11 is 61 nF. The second capacitance C2 is larger than the capacitance Cesc (first capacitance C1) of the first portion P1 of the dielectric membrane 12 between the electrodes 31 and 32 and the sample 4. In this case, the magnitude of the ESC current J estimated by Equation 2 is 75% of the magnitude of the ESC current J0 of the first comparative example. In the process of the membrane structure 40 using such a structure, it has been acknowledged that since the suppression of the ESC current is not sufficient, part of the portion B of the membrane structure 40 disappears, causing damage.

[Effects, Etc. (1-2)]

As described above, in the mounting example of the ESC system 5 in the first embodiment, the capacitance of the portion of the dielectric membrane between the ESC electrode and the ESC base metal (second capacitance C2, capacitance Cb) is set to a value smaller than the capacitance of the portion of the dielectric membrane between the ESC electrode and the sample (first capacitance C1, capacitance Cesc) (C2<C1, Cb<Cesc). Moreover, the sum of the capacitance of the capacitors in the LPF circuit (third capacitance C3, capacitance Cf) is set to a value smaller than the capacitance of the portion of the dielectric membrane between the ESC electrode and the sample (first capacitance C1, capacitance Cesc) (C3<C1, Cf<Cesc). As a result, the ESC current flowing into the sample 4 between steps in which the value of the RF bias power (voltage Vdc) differs is reduced, and damage to the sample 4 due to the ESC current can be suppressed.

[Modification-LPF Circuit]

Figure 11:
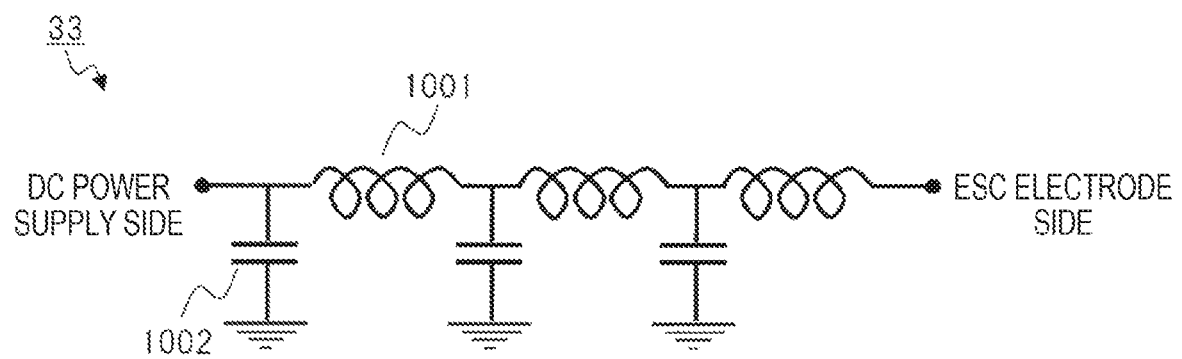
FIG. 11 is a diagram schematically showing another configuration example of an LPF circuit connected to an ESC electrode in the plasma processing apparatus of the first embodiment.

In the circuit configuration example of the LPF 33 in FIG. 10 of the first embodiment, a so-called single-stage filter circuit in which one coil 1001 and one capacitor 1002 are combined is used. In addition, as an LPF circuit, for example, as shown in FIG. 11, even when a multistage filter circuit in which a plurality of circuits each of which is constituted by a set of the coil 1001 and the capacitor 1002 is connected in series is used, a similar effect can be obtained. FIG. 11 schematically shows a circuit configuration example of the LPF 33 in the plasma processing apparatus 1 according to the modification. In FIG. 11 a plurality of circuits each of which is constituted by a set of the coil 1001 and the capacitor 1002 is serially connected in three stages between the electrode 30 and the DC power supply 34.

Mounting Example

Figure 12:
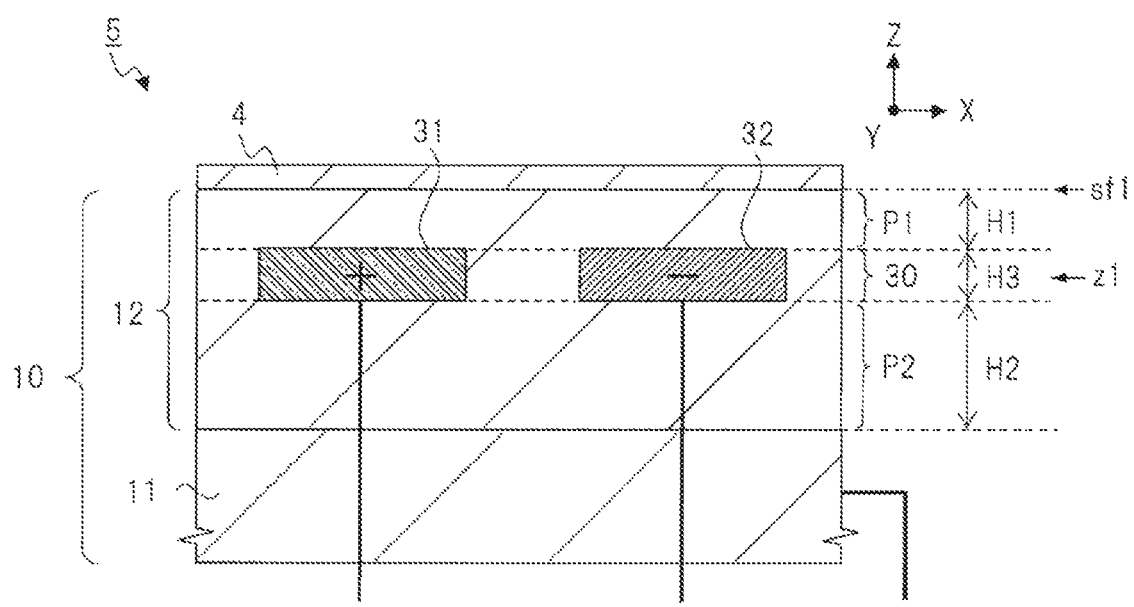
FIG. 12 is a vertical cross-sectional view schematically showing a configuration outline of a mounting example of the ESC system in the plasma processing apparatus of the first embodiment.

In the first embodiment, as a mounting example, in order to reduce the capacitance of the portion of the dielectric membrane between the ESC electrode and the sample (first capacitance C1, the capacitance Cesc), as shown in FIG. 12, the distance of the second portion P2 of the dielectric membrane 12 between the electrode 30 and the ESC base metal 11 is increased.

FIG. 12 shows a configuration example relating to the thickness of the dielectric membrane 12 in the ESC system 5 of the mounting example. In the dielectric membrane 12, the plurality of electrodes 30 (31, 32) disposed at the position z1 in the thickness direction (Z direction) has a predetermined thickness H3. The first portion P1 of the dielectric membrane 12 between the upper surface of the electrode 30 and the rear surface (placement surface sf1) of the sample 4 has a predetermined thickness H1. The second portion P2 of the dielectric membrane 12 between the lower surface of the electrode 30 and the upper surface of the ESC base metal 11 has a predetermined thickness H2.

In this mounting example, the thickness H2 of the second portion P2 is larger than the thickness H1 of the first portion P1. As a result, as described above, the first capacitance C1 is reduced.

Not limited to such a mounting example, as an modification, even when a member made of a dielectric material having a low dielectric constant is disposed between the lower surface of the electrode 30 and the upper surface of the ESC base metal 11, a similar effect can be obtained.

[Effects Etc. (1-3)]

As described above, according to the plasma processing apparatus 1 of the first embodiment, the processing of the sample 4 using the sample stage 10 having the ESC system 5 is performed, so that the processing yield can be improved. According to the plasma processing apparatus 1, in the multi-step etching process in which the RF bias power varies, the ESC current flowing through the sample 4 can be significantly reduced when the voltage Vdc varies between steps as compared with the case of the prior art example. Therefore, according to the plasma processing apparatus 1, even when there is the membrane structure 40 or the like having a high antenna ratio in the sample 4, damage due to the ESC current can be suppressed. That is, according to the plasma processing apparatus 1, the performance of a semiconductor device manufactured by performing a process using plasma is not impaired and the processing yield can be improved.

Second Embodiment

In addition to the plasma processing apparatus 1 of the first embodiment, a plasma processing apparatus of the other embodiments (modification) as described below can be also applied. Hereinafter, components in each embodiment different from those of the first embodiment will be described.

Figure 13:
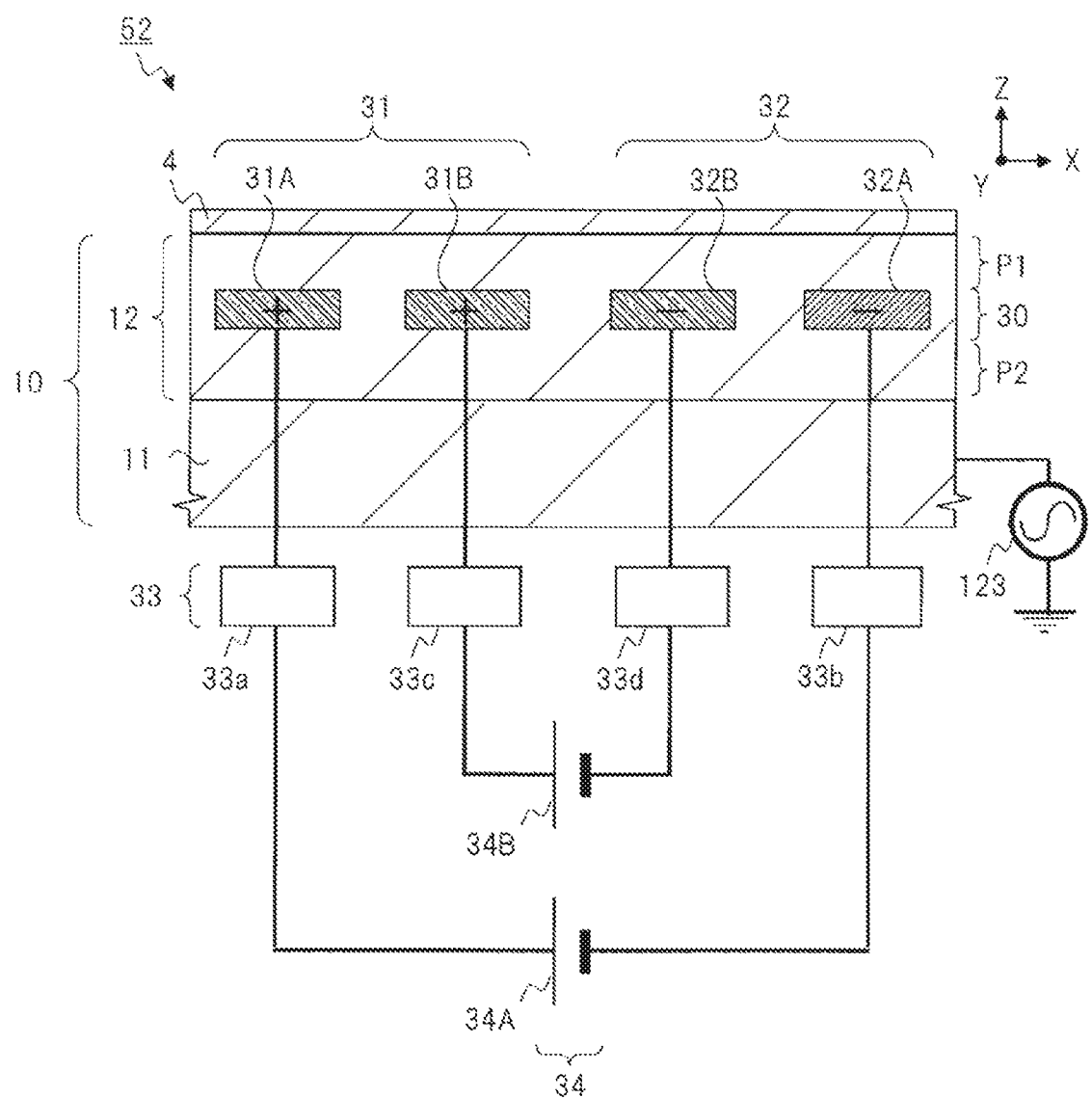
FIG. 13 is a vertical cross-sectional view schematically showing a configuration outline of a sample stage and an ESC system in a plasma processing apparatus according to a second embodiment of the present invention.

With reference to FIG. 13, the ESC system of the plasma processing apparatus according to the second embodiment of the present invention will be described. In the first embodiment, as shown in FIG. 3, the ESC system 5 including one positive electrode and one negative electrode as the ESC electrodes 30 and one DC power supply 34 has been described. The ESC system of the plasma processing apparatus of the second embodiment includes a plurality of pairs of electrodes to which the positive polarity and the negative polarity are imparted and a plurality of DC power supplies connected to the plurality of pairs of electrodes.

FIG. 13 is a vertical cross-sectional view schematically showing the outline of the configuration of the ESC system 52 in the second embodiment. The sample stage 10 is provided with the ESC system 52. The ESC system 52 includes, as a plurality of ESC electrodes 30, the positive polarity electrode 31 and the negative polarity electrode 32. Furthermore, each polarity electrode is composed of a pair of electrodes. The electrode 31 has a pair of electrodes, which is an electrode 31A and an electrode 31B. The electrode 32 has a pair of electrodes, which is the electrode 32A and the electrode 32B. The respective electrodes 30 are electrically connected to the corresponding positive and negative output terminals of the DC power supply 34 via the LPF 33. The LPF 33 includes an LPF 33a, an LPF 33b, an LPF 33c, and an LPF 33d as a plurality of LPF circuits. A pair of LPF 33a and LPF 33b, and a pair of LPF 33c and LPF 33d are provided. The DC power supply 34 has a first DC power supply 34A and a second DC power supply 34B as two DC power supplies.

In the X-Y plane of the sample stage 10 and the dielectric membrane 12 in planar view, for example, the electrode 31A and the electrode 32A on one side (outer side in the X direction in the figure) are electrically connected to the positive and negative electrode terminals of the first DC power supply 34A via the LPF 33 (LPF 33a, 33b), respectively. The electrode 31A is connected to the positive electrode terminal of the first DC power supply 34A via the LPF 33a, and is imparted the positive polarity. The electrode 32A is connected to the negative electrode terminal of the first DC power supply 34A via the LPF 33b, and is imparted the negative polarity. The electrode 31B and the electrode 32B on the other side (inner side in the X direction shown in the figure) are electrically connected to the positive and negative electrode terminals of the second DC power supply 34B via the LPF 33 (LPF 33c, 33d), respectively. The electrode 31B is connected to the positive electrode terminal of the second DC power supply 34B via the LPF 33c, and is imparted the positive polarity. The electrode 32B is connected to the negative electrode terminal of the second DC power supply 34B via the LPF 33d, and is imparted the negative polarity.

In the second embodiment, the configuration of the equivalent circuit for each of a pair of ESC electrodes is the same as that of the above (FIG. 8). The positions and shapes of the plurality of electrodes 30 in the X-Y plane in planar view are not limited to the configuration shown in FIG. 12, and are not particularly limited.

In the ESC system 52 of FIG. 13, the distance of the first portion P1 of the dielectric membrane 12 between the upper surface of the two pairs of electrodes 30 (31, 32) for the ESC and the rear surface (placement surface sf1) of the sample 4 is set to 0.3 mm. The distance of the second portion P2 of the dielectric membrane 12 between the lower surface of the electrode 30 and the upper surface of the ESC base metal 11 is set to 2.1 mm. In addition, the dielectric membrane 12 is made of aluminum oxide as a material. In this configuration, the capacitance Cesc corresponding to the capacitance of the portion of the dielectric membrane between the ESC electrode and the sample (first capacitance C1) is set to 20 nF. Further, the capacitance Cb corresponding to the capacitance of the portion of the dielectric membrane between the ESC electrode and the ESC base metal (second capacitance C2) is set to 2.9 nF.

However, in this configuration, the positive and negative electrodes 31 and 32 have the following configuration, for example. That is, a pair of electrodes 31B and 32B to which positive and negative polarities are imparted is disposed near the center part of the upper portion of the sample stage 10 (near the center axis of the dashed line in FIG. 1). In addition, another pair of electrodes 31A and 32A to which positive and negative polarities are imparted is disposed on the outer peripheral part of the upper portion of the sample stage 10. That is, two pairs of electrodes, which means a total of four electrodes, are disposed. In other words, for example, a first pair of positive and negative electrodes is disposed on the inner peripheral portion and a second pair of positive and negative electrodes is disposed on the outer peripheral portion of the sample stage 10 in one direction (X direction).

Each of the electrodes of the plurality of pairs of electrodes to which positive and negative polarities are imparted is electrically connected via the LPF 33 to respective positive and negative electrode terminals of two DC power supplies 34 which are completely brought to a floating potential at least during the processing of the sample 4. As a result, positive and negative DC voltages are applied to the respective electrodes of the plurality of electrodes 30 (31, 32) as shown in the figure. An electrostatic force is generated between the positive electrode 31 and the negative electrode 32.

Further, in the second embodiment, the capacitance (third capacitance C3, capacitance Cf) of the capacitor of the circuit constituting the LPF 33 is set to 0.25 nF. The LPF 33 of the second embodiment includes a total of four LPF circuits (LPF 33a to LPF 33d) as shown in the figure. The capacitance Cf (third capacitance C3), which is the sum of the capacitance of the capacitors in the LPF circuits as a whole, is 1 nF which is sufficiently smaller than the capacitance Cesc (first capacitance C1). As a result, the value J of the ESC current calculated by Equation 2 is about ⅐ of the value J0 of the ESC current in the ESC system 19 of the first comparative example in FIG. 17.

When the membrane structure 40 of the sample 4 in FIG. 2 is processed using the ESC system 52 of the second embodiment, it has been acknowledged that no damage to the sample 4 occurs since the ESC current is sufficiently suppressed.

Next, as a comparative example in the second embodiment, a case where the capacitance of the capacitor disposed in the circuit constituting the LPF 33 is set to 25 nF is examined. In this case, the capacitance Cf (third capacitance C3), which is the sum of the capacitance of the capacitors in the LPF 33 circuit, is 100 nF, which is larger than the capacitance Cesc (first capacitance C1). The value J of the ESC current represented by Equation 2 is 83% of the value J0 of the ESC current in the case of the first comparative example in FIG. 17. In addition, when the membrane structure 40 of FIG. 2 is processed by using the ESC system of this comparative example, it has been acknowledged that the suppression of the ESC current J is insufficient, so that the portion B of the sample 4 disappears, causing damage.

As described above, in the configuration of the second embodiment, the capacitance of the portion of the dielectric membrane between the ESC electrode and the ESC base metal (second capacitance C2, capacitance Cb) is set to a value which is smaller than the capacitance of the portion of the dielectric membrane between the ESC electrode and the sample (first capacitance C1, capacitance Cesc). Furthermore, the sum of the capacitance of the capacitors of the LPF circuit (third capacitance C3, capacitance Cf) is set to a value which is smaller than the capacitance of the portion of the dielectric membrane between the ESC electrode and the sample (first capacitance C1, capacitance Cesc). As a result, it has been found that according to the second embodiment, the ESC current flowing into the sample 4 can be reduced and damage to the sample 4 due to the ESC current can be suppressed. In the ESC system 52 of FIG. 13, two pairs of positive and negative electrodes 31 and 32 and two pairs of DC power supplies 34 are used as an example. The embodiment is not limited to this. Even in a configuration in which three or more pairs are used, if the third capacitance C3 is made smaller than the first capacitance C1 in the same manner as described above, a similar effect can be obtained.

Third Embodiment

Figure 14A:
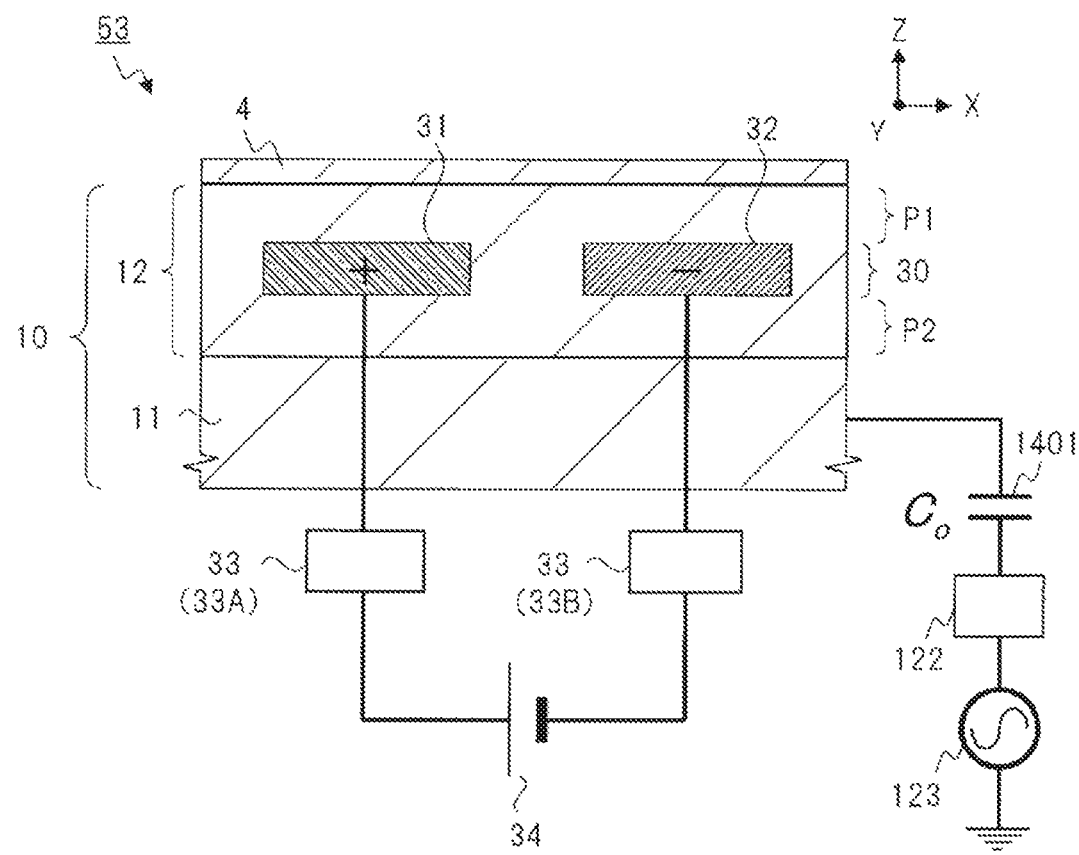
FIG. 14A is a vertical cross-sectional view schematically showing a configuration outline of a sample stage and an ESC system in a plasma processing apparatus according to a third embodiment of the present invention.
Figure 14B:
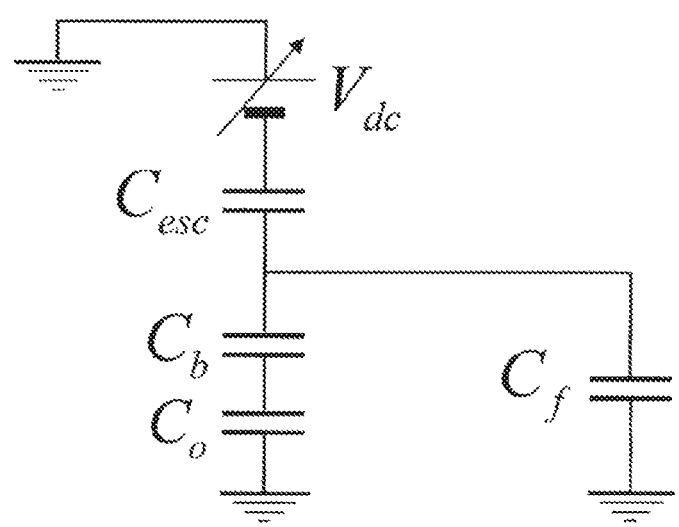
FIG. 14B is an equivalent circuit of FIG. 14A.

Next, with reference to FIGS. 14A and 14B, the ESC system of the plasma processing apparatus according to the third embodiment of the present invention will be described. FIG. 14A is a vertical cross-sectional view schematically showing the configuration outline of the ESC system 53 according to the third embodiment. FIG. 14B shows an electrical equivalent circuit including the ESC system 53 of FIG. 14A.

In the third embodiment, in order to reduce the capacitance of the portion of the dielectric membrane between the ESC electrode and the sample (first capacitance C1, capacitance Cesc), instead of the configuration in which the distance of the second portion P2 between the electrode 30 and the ESC base metal 11 is increased as in the above mentioned mounting example of FIG. 12, the following configuration is provided. That is, in the third embodiment, as shown in FIG. 14A, a capacitor 1401 having a small capacitance is inserted and disposed at a position between the ESC base metal 11 and the matching unit 122 on the power supply path of the RF power for electrically connecting the sample stage 10 and the RF power supply 123. As a result, the effective capacitance of the circuit constituting the ESC system 53 is lowered. Let the capacitance of the capacitor 1401 be capacitance Co.

In the ESC system 53 of the third embodiment, as a mounting example, the distance of the first portion P1 between the upper surface of the electrode 30 (31, 32) and the rear surface (placement surface sf1) of the sample 4 is set to 0.3 mm. The distance of the second portion P2 between the lower surface of the electrode 30 and the upper surface of the ESC base metal 11 is set to 0.1 mm. Also, aluminum oxide is used as the dielectric material of the dielectric membrane 12 disposed in this distance relationship. In this configuration, the capacitance Cesc corresponding to the capacitance of the portion of the dielectric membrane between the ESC electrode and the sample (first capacitance C1) is 20 nF. Further, the capacitance Cb corresponding to the capacitance of the portion of the dielectric membrane between the ESC electrode and the ESC base metal (second capacitance C2) is 61 nF.

In the configuration of the third embodiment, as in the configuration of the first embodiment shown in FIG. 3, a positive electrode terminal and a negative electrode terminal of the DC power supply 34 which are completely brought to a floating potential during at least processing are electrically connected to the corresponding positive and negative electrodes 31 and 32 via respective LPFs 33 (33A, 33B). A DC voltage is applied to these electrodes 31 and 32, and positive and negative polarities are imparted. The capacitance Cf (third capacitance C3) of the capacitors disposed in the circuit of the LPF 33 in the ESC system 53 as a whole circuit is set to 0.25 nF which is sufficiently smaller than the capacitance Cesc.

FIG. 14B shows an equivalent circuit for the DC component concerning the LPF 33 in the third embodiment. This equivalent circuit is obtained by inserting the capacitance Co corresponding to the capacitor 1401 in series with the capacitance Cb between the capacitance Cb of the capacitor and the grounded portion in the circuit of FIG. 8 described above. Therefore, the value J of the ESC current in this system is obtained by replacing Cb in Equation 2 with composite capacitance Cb' expressed by Equation 3 below.

[Math. 3]

$$C'_b = \frac{C_b C_o}{C_b + C_o} \qquad \text{Equation 3}$$

Here, when the value of the capacitance Co is 3 nF, the composite capacitance Cb' is 2.9 nF from the Equation 3. The value of Cb' is the same value as when the distance between the electrode 30 and the ESC base metal 11 in the ESC system 5 of FIG. 3 is set to 2.1 mm. Therefore, the value J of the ESC current in the configuration of the third embodiment is reduced to about 1/7 of the value J0 of the ESC current of the first comparative example in FIG. 17. In addition, when the processing of the membrane structure 40 of FIG. 2 is performed using the ESC system 53 of the third embodiment, it is acknowledged that damage is reduced.

As described above, in the third embodiment, in the configuration of FIG. 14A, the capacitor 1401 having a capacitance (capacitance Co) smaller than the capacitance of the portion of the dielectric membrane between the ESC electrode and the ESC base metal (second capacitance C2, capacitance Cb) is connected and disposed between the ESC base metal 11 and the matching unit 122 in series. As a result, it has been found that the ESC current flowing into the sample 4 can be suppressed and damage to the sample 4 by the ESC current can be suppressed.

In the third embodiment, the capacitor 1401 is disposed on the RF power supply path between the ESC base metal 11 and the matching unit 122. The present invention is not limited to this, and as long as the capacitor 1401 is disposed at a position to represent the equivalent electrical circuit, a similar effect can be obtained, for example, even by a configuration in which the capacitor 1401 is disposed in the matching unit 122.

Fourth Embodiment

Figure 15A:
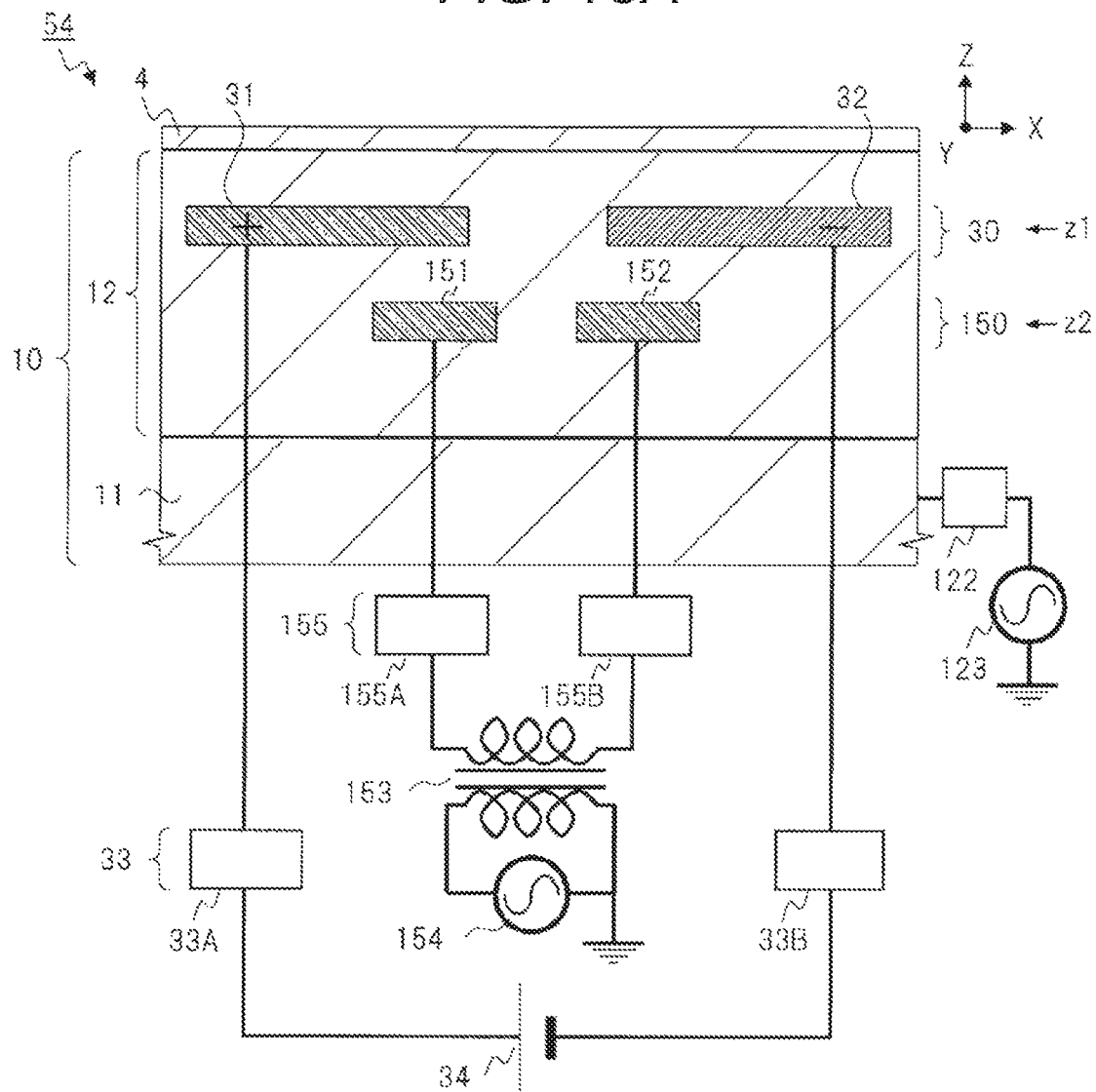
FIG. 15A is a vertical cross-sectional view schematically showing a configuration outline of a sample stage and an ESC system in a plasma processing apparatus according to a fourth embodiment of the present invention.
Figure 15B:
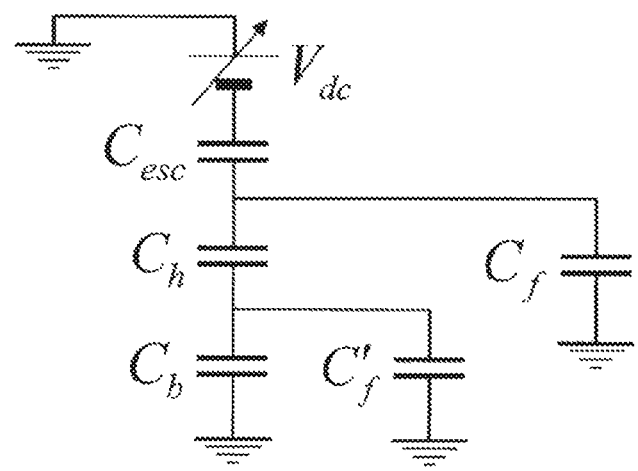
FIG. 15B is an equivalent circuit of FIG. 15A.

Next, with reference to FIGS. 15A and 15B and 16A and 16B, the ESC system of the plasma processing apparatus according to the fourth embodiment of the present invention will be described. FIG. 15A shows a configuration outline of the ESC system 54 and the like in the fourth embodiment. FIG. 15B shows an equivalent circuit including the ESC system 54 of FIG. 15A. As shown in FIG. 15A, the ESC system 54 according to the fourth embodiment includes a heater electrode 150 as a heater in the sample stage 10, in particular, in the dielectric membrane 12. In the fourth embodiment, a configuration example in the case of adding a heater system based on the ESC system 5 of the first embodiment will be described. Note that the heater electrode 150 itself is a known technique. It is possible to control the temperature of the sample stage 10 during processing and the like by controlling the temperature of the heater electrode 150.

The ESC system 54 of FIG. 15A has the ESC electrodes 30 (31, 32) at a predetermined position z1 closer to the placement surface sf1 in the thickness direction (Z direction) within the dielectric membrane 12. The DC power supply 34 is connected to the electrode 30 via the LPF 33 in the same manner as described above.

Further, a plurality of heater electrodes 150 is disposed at a predetermined position z2 between the lower surface of the electrode 30 and the upper surface of the ESC base metal 11. The plurality of heater electrodes 150 includes a pair of two heater electrodes, that is, a heater electrode 151 and a heater electrode 152. The plurality of heater electrodes 150 is spaced apart from each other by a predetermined distance in one direction (X direction) in the horizontal direction. The heater electrode 150 is made of a tungsten material and has a film shape with a predetermined thickness.

In this example, the heater electrodes 151 and 152 provided as a pair of heater electrodes correspond to a pair of positive and negative electrodes 31 and 32. The pair of the heater electrodes 151 and 152 is disposed at a further inner position than the pair of positive and negative electrodes 31 and 32. The width of each of the plurality of heater electrodes 150 in the X direction is smaller than the width of the electrode 30 in the X direction. Various configurations are possible without being limited to the configuration in this example.

The ceramic dielectric membrane 12 is made of aluminum oxide. As a mounting example, the distance of the portion of the dielectric membrane 12 between the upper surface of the electrode 30 and the rear surface of the sample 4 is 0.3 mm. The distance of the portion of the dielectric membrane 12 between the lower surface of the electrode 30 and the upper surface of the heater electrode 150 is 0.3 mm. The distance of the portion of the dielectric membrane 12 between the lower surface of the heater electrode 150 and the upper surface of the ESC base metal 11 is 1.8 mm.

In the configuration of the ESC system 54 of the fourth embodiment, the capacitance Cesc corresponding to the capacitance of the portion of the dielectric membrane between the ESC electrode and the sample (first capacitance C1) is set to 20 nF. The capacitance Ch corresponding to the capacitance of the portion of the dielectric membrane between the ESC electrode and the heater electrode (referred to as a fourth capacitance C4) is set to 20 nF. The capacitance Cb corresponding to the capacitance of the portion of the dielectric membrane between the heater electrode and the ESC base metal (referred to as a fifth capacitance C5) is set to 3.4 nF.

Each of the plurality of heater electrodes 150 (151, 152) is electrically connected to an alternating current power supply (AC power supply) 154 via a power supply path including an LPF 155 (LPF 155A, 155B), which is a heater LPF (AC: alternating current). The heater electrode 151 associated with the positive electrode 31 is connected to one end of an insulating transformer 153 via the LPF 155A. The heater electrode 152 associated with the negative electrode 32 is connected to the other end of the insulating transformer 153 via the LPF 155B. AC power from the AC power supply 154 is supplied to each of the heater electrodes 150. The AC power supply 154 and the LPF 155 are electrically connected to each other via an insulating transformer 153 disposed therebetween. AC power from the AC power supply 154 is supplied to the LPF 155 and the heater electrode 150 in a state of being completely insulated in direct current manner.

Further, the capacitance of the capacitor disposed in the circuit constituting the LPF 155 is set to 0.25 nF. The capacitance Cf, which is the sum of the capacitance of the capacitors in the LPF 155 on the circuit feeding electric power to the heater electrode 150, is set to 0.5 nF, which is sufficiently smaller than the capacitance Cesc.

In the equivalent circuit of FIG. 15B, the capacitance Cesc of the capacitance corresponding to the portion between the sample 4 and the electrode 30 is connected to the capacitor of the capacitance Ch corresponding to the portion between the electrode 30 and the heater electrode 150 and the capacitor of the capacitance Cf corresponding to the LPF 33 while the capacitor of the capacitance Ch and the capacitor of the capacitance Cf are connected in parallel. The capacitor of the capacitance Ch is connected to the capacitor of the capacitance Cb corresponding to the portion between the heater electrode 150 and the ESC base metal 11 and the capacitor of the capacitance Cf corresponding to the LPF 155 on the heater side while the capacitor of the capacitance Cb and the capacitor of the capacitance Cf are connected in parallel.

From this equivalent circuit, the value J of the ESC current flowing from the plasma through the sample 4 to the sample stage 10 when the voltage Vdc fluctuates in the fourth embodiment is expressed by the following Equation 4.

[Math. 4]

$$J = \frac{C_f + C_b''}{C_f + C_b'' + C_{esc}} J_o \qquad \text{Equation 4}$$

In Equation 4, the capacitance Cb", which is the composite capacitance, is expressed by the following Equation 5.

[Math. 5]

$$C_b'' = \frac{C_h(C_f' + C_b)}{C_h + C_f' + C_b} \qquad \text{Equation 5}$$

In the ESC system 54 of the fourth embodiment having the above configuration, the value J of the flowing ESC current is reduced to about 1/7 of the ESC current value J0 of the first comparative example in FIG. 17. In addition, when the membrane structure 40 of FIG. 2 is processed using the plasma processing apparatus 1 including the ESC system 54 of the fourth embodiment, it has been acknowledged that the ESC current is sufficiently suppressed, and damage to the sample 4 is reduced.

Comparative Example (1) of Fourth Embodiment

Next, the following configuration is examined as the ESC system of the comparative example to the above-described the fourth embodiment. In this comparative example, the case where the capacitance of the capacitor in the circuit constituting the LPF 155 on the heater side in FIGS. 15A and 15B is set to a value larger than the capacitance Cesc, for example, 25 nF is examined. In this configuration, the sum of capacitance of the capacitors of the LPF 155 is 50 nF. In addition, the composite capacitance Cb" represented by Equation 5 is 14.5 nF. In this case, the value J of the ESC current is 42% of the value J0 of the ESC current of the first comparative example in FIG. 17. Meanwhile, when the membrane structure 40 of FIG. 2 is processed using the plasma processing apparatus having the ESC system of this comparative example, suppression of the ESC current is insufficient, so that part of the portion B disappears, causing damage.

Comparative Example (2) of Fourth Embodiment

Figure 16A:
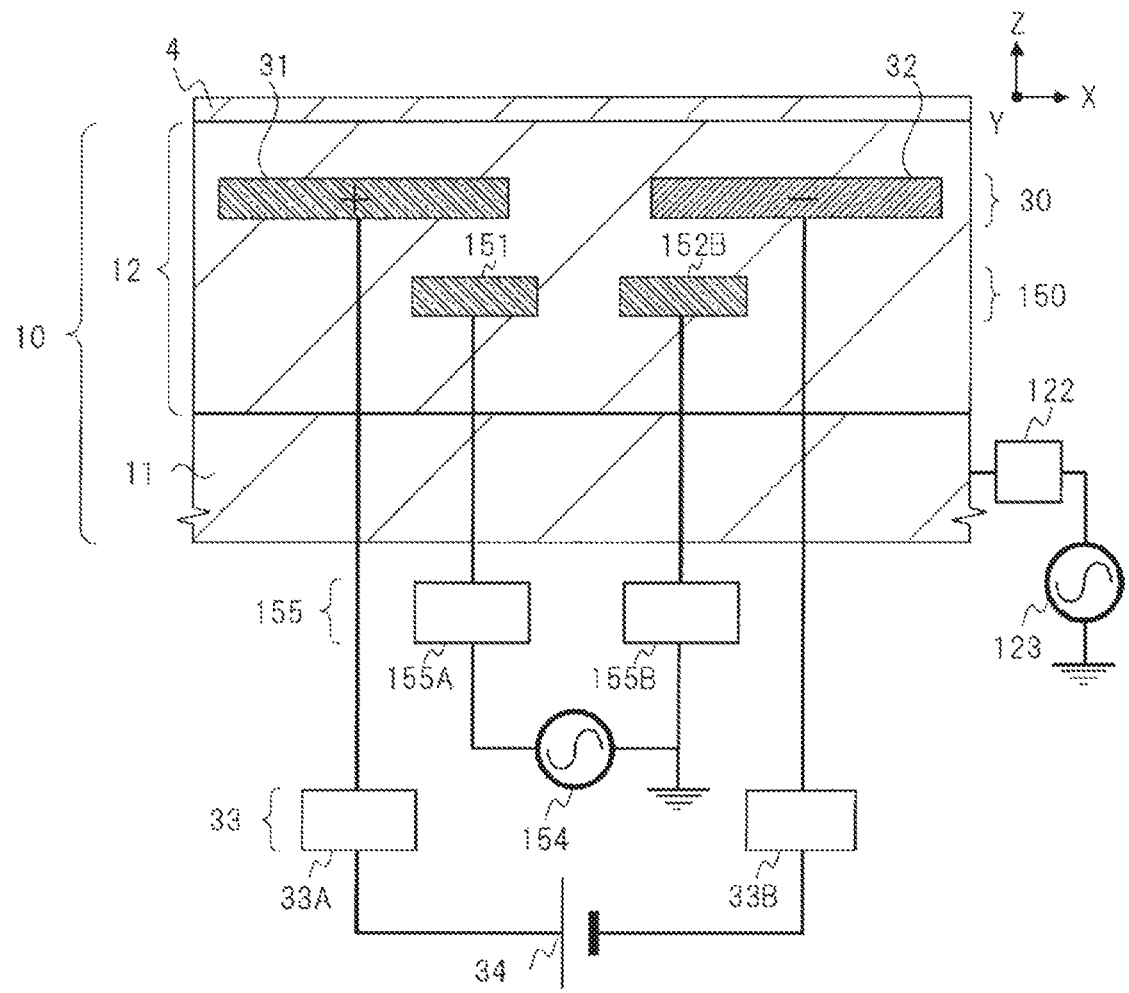
FIG. 16A is a vertical cross-sectional view schematically showing a configuration outline of a sample stage and an ESC system in a plasma processing apparatus of another comparative example with respect to the fourth embodiment.
Figure 16B:
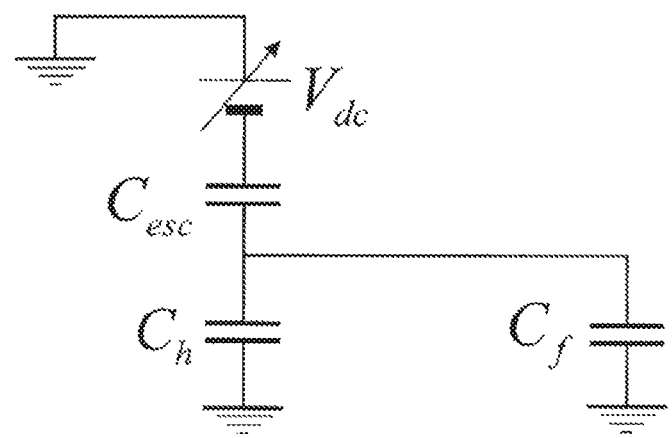
FIG. 16B is an equivalent circuit of FIG. 16A.

Next, the following configuration is examined as the ESC system of another comparative example to the above-described the fourth embodiment. FIG. 16A shows a configuration outline of the ESC system of the plasma processing apparatus of this comparative example. FIG. 16B shows an equivalent circuit for the DC component including the ESC system in FIG. 16A. In the configuration of this comparative example, as shown in FIG. 16A, the heater electrode 150 and the AC power supply 154 of FIG. 15A are electrically connected to each other via the LPF 155 without the insulating transformer 153 being interposed, and AC power is supplied to the heater electrode 150. Except for the insulating transformer 153, the ESC system of this comparative example has substantially the same configuration as the ESC system of the fourth embodiment of FIG. 15A.

In the equivalent circuit of FIG. 16B, the capacitance Cf and the capacitance Ch which are connected in parallel are connected to the capacitance Cesc. Based on this equivalent circuit, the value J of the ESC current flowing from the plasma through the sample 4 to the sample stage 10 when the voltage Vdc fluctuates is expressed by Equation 6 below.

[Math. 6]

$$J = \frac{C_f + C_h}{C_f + C_h + C_{esc}} J_o \qquad \text{Equation 6}$$

The value J of the ESC current in this comparative example is 50% of the ESC current value J0 in the first comparative example in FIG. 17. Furthermore, when the membrane structure 40 of FIG. 2 is processed by using the plasma processing apparatus having the ESC system of this comparative example, it has been acknowledged that suppression of the ESC current is insufficient, so that the sample is damaged.

In view of the above, when supplying AC power to the heater electrode 150 disposed in the dielectric membrane 12 of the ESC system, as shown in FIG. 15A, AC power is supplied from the AC power supply 154 via the insulating transformer 153 and the LPF 155. At the same time, the sum of the capacitance of the capacitors in the LPF 155 (capacitance Cf) is set to be smaller than the capacitance of the portion of the dielectric membrane between the ESC electrode and the sample (capacitance Cesc) (Cf'<Cesc). As a result, it has been found that the ESC current flowing into the sample 4 is suppressed, and damage to the sample 4 by the ESC current is suppressed.

In FIGS. 15A and 15B and 16A and 16B, an example in which only one AC power supply for the heater electrode is used has been described. The present invention is not limited to this. Even in a configuration in which power is supplied to the heater electrode by using a plurality of AC power supplies, the insulating transformer 153 and the LPF 155 are used, and the above mentioned capacitance is set (Cf'<Cesc), so that a similar effect can be obtained.

Although the present invention has been specifically described based on the embodiments, the present invention is not limited to the above-described embodiments, and various modifications can be made without departing from the gist thereof. For example, in the electric circuit to which the electrode 30, the LPF 33, and the DC power supply 34 in FIG. 3, etc. are connected, it is of course possible to add a switch circuit or the like for controlling the electrical on/off.

What is claimed is:

1. A plasma processing apparatus comprising:
a processing chamber which is disposed in a vacuum vessel and in which plasma is generated inside the vacuum vessel;
a sample stage which is disposed inside of the processing chamber and on which a sample to be processed using the plasma is placed;
a dielectric member forming an upper surface portion of the sample stage including a placement surface on which the sample is placed;
a plurality of film-shaped electrodes which is disposed at a same height in a vertical direction inside the dielectric member, to which a DC power from a DC power supply is supplied, and which is electrically connected to the DC power supply via a low pass filter circuit including a first and a second low pass filter circuit, to which a DC power from the DC power supply is supplied, to which a predetermined polarity is imparted, and in which an electrostatic force for attracting the sample is formed; and
a bias electrode made of a conductor, the bias electrode being disposed below the dielectric member in the sample stage and supplied with radio frequency power for forming a radio frequency bias potential from a radio frequency power supply during the processing of the sample,
wherein the plurality of electrodes includes a first electrode to which a positive polarity is imparted and a second electrode to which a negative polarity is imparted based on the DC power,
wherein the first electrode is electrically connected to a positive electrode terminal of the DC power supply via the first low pass filter circuit,
wherein the second electrode is electrically connected to a negative electrode terminal of the DC power supply through the second low pass filter circuit,
wherein power supply paths of the DC power between the first electrode and the positive electrode terminal of the DC power supply and between the second electrode and the negative electrode terminal of the DC power supply are not electrically connected to ground so that the positive electrode terminal and the negative electrode terminal of the DC power supply, and the plurality of electrodes, are brought into an electrically floating state during processing of the sample,
wherein the dielectric member and the plurality of electrodes comprise a first portion P1 disposed between an upper surface of the plurality of electrodes and a lower surface of the sample when disposed on the sample stage, and a second portion P2 disposed between the lower surface of the plurality of electrodes and an upper surface of a base metal,
wherein the first portion P1 has a first capacitance C1, the second portion P2 has a second capacitance C2, and a sum of capacitances of two or more capacitors in the low mass filter circuit is a third capacitance C3, and
wherein a sum (C2+C3) of the second capacitance C2 and the third capacitance C3 is smaller than the first capacitance C1 to suppress an electrostatic current which flows through the sample during processing of the sample.

2. The plasma processing apparatus according to claim 1, wherein a circuit constant of the low pass filter circuit is smaller than a frequency of the radio frequency power.

3. The plasma processing apparatus according to claim 1, wherein each of a capacitance C2 of a second portion P2 of the dielectric member between the plurality of electrodes and the bias electrode, and a sum of the capacitance C3 of capacitors in the first and second low pass filter circuits, is smaller than a capacitance C1 of a first portion of the dielectric member between the plurality of electrodes and the sample.

4. The plasma processing apparatus according to claim 1, wherein a thickness of the second portion of the dielectric member between the plurality of electrodes and the bias electrode is larger than a thickness of the first portion of the dielectric member between the plurality of electrodes and the sample.

5. The plasma processing apparatus according to claim 1, wherein the plurality of electrodes includes a plurality of pairs of the first electrode and the second electrode, wherein the plasma processing apparatus comprises a plurality of DC power supplies as the DC power supply, and wherein each pair of the first electrode and the second electrode of the plurality of pairs is electrically connected, through the low pass filter circuit, to a positive electrode terminal and a negative electrode terminal of each of the plurality of DC power supplies, respectively.

6. The plasma processing apparatus according to claim 1, wherein a capacitor having a capacitance smaller than the capacitance of the second portion of the dielectric member between the plurality of electrodes and the bias electrode is provided on a power supply path of radio frequency power between the bias electrode and the radio frequency power supply.

7. The plasma processing apparatus according to claim 1, further comprising:
a plurality of heater electrodes disposed between the plurality of electrodes and the bias electrode in the dielectric member;
an insulating transformer electrically connected to the plurality of heater electrodes via corresponding heater low pass filter circuits; and
an AC power supply electrically connected to the insulating transformer,
wherein AC power from the AC power supply is supplied to the corresponding heater low pass filter circuits or the plurality of heater electrodes via the insulating transformer.

* * * * *